United States Patent
Swenberg et al.

(10) Patent No.: US 10,103,027 B2
(45) Date of Patent: Oct. 16, 2018

(54) HYDROGENATION AND NITRIDIZATION PROCESSES FOR MODIFYING EFFECTIVE OXIDE THICKNESS OF A FILM

(71) Applicant: Applied Materials, Inc., Santa Clara, CA (US)

(72) Inventors: Johanes S. Swenberg, Los Gatos, CA (US); Wei Liu, San Jose, CA (US); Houda Graoui, Gilroy, CA (US); Shashank Sharma, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/442,311

(22) Filed: Feb. 24, 2017

(65) Prior Publication Data
US 2017/0365480 A1    Dec. 21, 2017

Related U.S. Application Data

(60) Provisional application No. 62/352,287, filed on Jun. 20, 2016, provisional application No. 62/352,817, filed on Jun. 21, 2016, provisional application No. 62/430,912, filed on Dec. 6, 2016.

(51) Int. Cl.
| | | |
|---|---|---|
| H01L 21/28 | (2006.01) | |
| H01L 29/40 | (2006.01) | |
| H01L 21/02 | (2006.01) | |
| H01L 21/324 | (2006.01) | |
| H01L 21/321 | (2006.01) | |

(52) U.S. Cl.
CPC .... *H01L 21/28255* (2013.01); *H01L 21/0234* (2013.01); *H01L 21/02186* (2013.01); *H01L 21/324* (2013.01); *H01L 21/3212* (2013.01); *H01L 29/401* (2013.01)

(58) Field of Classification Search
CPC .......... H01L 21/28255; H01L 21/0234; H01L 29/401; H01L 21/324
See application file for complete search history.

(56) References Cited

U.S. PATENT DOCUMENTS

| 2016/0196980 A1* | 7/2016 | Degai ..................... C23C 16/34 438/608 |
| 2017/0125536 A1* | 5/2017 | Chen ................. H01L 21/28088 |

* cited by examiner

*Primary Examiner* — Jay C Chang
*Assistant Examiner* — Mikka Liu
(74) *Attorney, Agent, or Firm* — Patterson + Sheridan LLP

(57) ABSTRACT

Embodiments described herein generally relate to enable the formation of a metal gate structure with a reduced effective oxide thickness over a similar structure formed via conventional methods. A plasma hydrogenation process followed by a plasma nitridization process is performed on a metal nitride layer in a film stack, thereby removing oxygen atoms disposed within layers of the film stack and, in some embodiments eliminating an oxygen-containing interfacial layer disposed within the film stack. As a result, an effective oxide thickness of the metal gate structure is reduced with little or no accompanying flatband voltage shift. Further, the metal gate structure operates with an increased leakage current that is as little as one quarter the increase in leakage current associated with a similar metal gate structure formed via conventional techniques.

18 Claims, 29 Drawing Sheets

HYDROGENATION AND NITRIDIZATION PROCESSES FOR MODIFYING EFFECTIVE OXIDE THICKNESS OF A FILM

CROSS-REFERENCE TO RELATED APPLICATION

The present application claims priority to U.S. Provisional Patent Application No. 62/352,287, filed on Jun. 20, 2016, U.S. Provisional Patent Application No. 62/352,817, filed on Jun. 21, 2016, and U.S. Provisional Patent Application No. 62/430,912, filed on Dec. 6, 2016, which are incorporated herein by reference in their entireties.

BACKGROUND

Field

Embodiments described herein generally relate to a method and apparatus for processing semiconductor substrates, and more particularly, to hydrogenation and nitridization processes modifying effective oxide thickness of a film.

Description of the Related Art

In integrated circuits, smaller transistors, such as metal oxide semiconductor field effect transistors (MOSFETs), are highly desirable. First, smaller transistors enable more transistors to be formed in a given chip area, thereby reducing chip size. Second, smaller transistors can generally switch faster than larger transistors, thereby improving chip performance.

One approach for reducing the size of a MOSFET is scaling, in which important device dimensions are reduced proportionally, such as transistor length, transistor width, and oxide (or dielectric) thickness. In this approach, transistor channel resistance does not change as transistor size is reduced, while gate capacitance and RC delay of the transistor decrease proportionally with the size reduction.

However, while the reduction of dielectric thickness in a MOSFET is crucial for scaling the MOSFET down to the size required by future technology nodes, there is also an important trade-off. Specifically, with a linear reduction of the thickness of the conventional oxide/oxynitride dielectric layer in MOSFETs, there is an exponential increase in gate leakage, resulting in increased power consumption. Moreover, the thickness of the dielectric layer is now close to a few atomic layers, raising reliability concerns. Thus, any means by which oxide thickness or effective oxide thickness (EOT) in a transistor can be reduced without an exponential increase in gate leakage is highly desirable. This and other needs are addressed in the present disclosure.

SUMMARY

Embodiments described herein generally relate to sequential hydrogenation and nitridization processes for reducing interfacial and bulk O atoms in a conductive structure in a semiconductor device. In one embodiment, a method of forming a structure in a semiconductor device includes depositing a high-k dielectric layer on a semiconductor substrate, depositing a metal nitride layer on the high-k metal dielectric layer to form a portion of the structure, wherein the portion includes the metal nitride layer and the high-k metal dielectric layer and has a first effective oxide thickness, and wherein the deposited metal nitride layer has an exposed surface, sequentially exposing the exposed surface to a non-oxidizing plasma-excited hydrogen species followed by plasma-excited nitrogen species to reduce the first effective oxide thickness to a second effective oxide thickness.

In another embodiment, a method of forming a structure in a semiconductor device includes depositing a high-k dielectric layer on a semiconductor substrate, depositing on the high-k metal dielectric layer a metal nitride layer, sequentially exposing the exposed surface to a plasma-excited hydrogen species followed by plasma-excited nitrogen species, after sequentially exposing the exposed surface to the plasma-excited hydrogen species followed by the plasma-excited nitrogen species, exposing the exposed surface to air, and after exposing the exposed surface to air, performing a thermal anneal process on the high-k dielectric layer and the metal nitride layer for a particular time and at a particular temperature.

In another embodiment, a method of forming a structure in a semiconductor device includes depositing a high-k dielectric layer on a semiconductor substrate, depositing a metal nitride layer on the high-k metal dielectric layer to form a portion of the structure, wherein the portion includes the metal nitride layer and the high-k metal dielectric layer and has a first effective oxide thickness, and wherein the deposited metal nitride layer has an exposed surface, reducing the first effective oxide thickness to a second effective oxide thickness by sequentially exposing the exposed surface to a non-oxidizing plasma-excited hydrogen species followed by plasma-excited nitrogen species.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to a method and apparatus for reducing interfacial and bulk oxygen (O) in a conductive structure in a semiconductor device. A decoupled plasma hydrogenation and/or plasma nitridization process may be performed on a metal layer or stack of metal layers that are included in the conductive structure, for example metal layers that are thermally annealed prior to deposition of a metal capping layer. In various embodiments, the plasma hydrogenation and/or plasma nitridization process may be performed prior to the thermal anneal process, after the thermal anneal process, or both before and after the thermal anneal process. In each embodiment, oxygen atom concentration in the conductive structure is beneficially reduced, thereby decreasing electrical resistance in the conductive structure. One such conductive structure is illustrated in FIG. 1.

Conductive Structure with Reduced Interfacial and Bulk Oxygen

Figure 1:
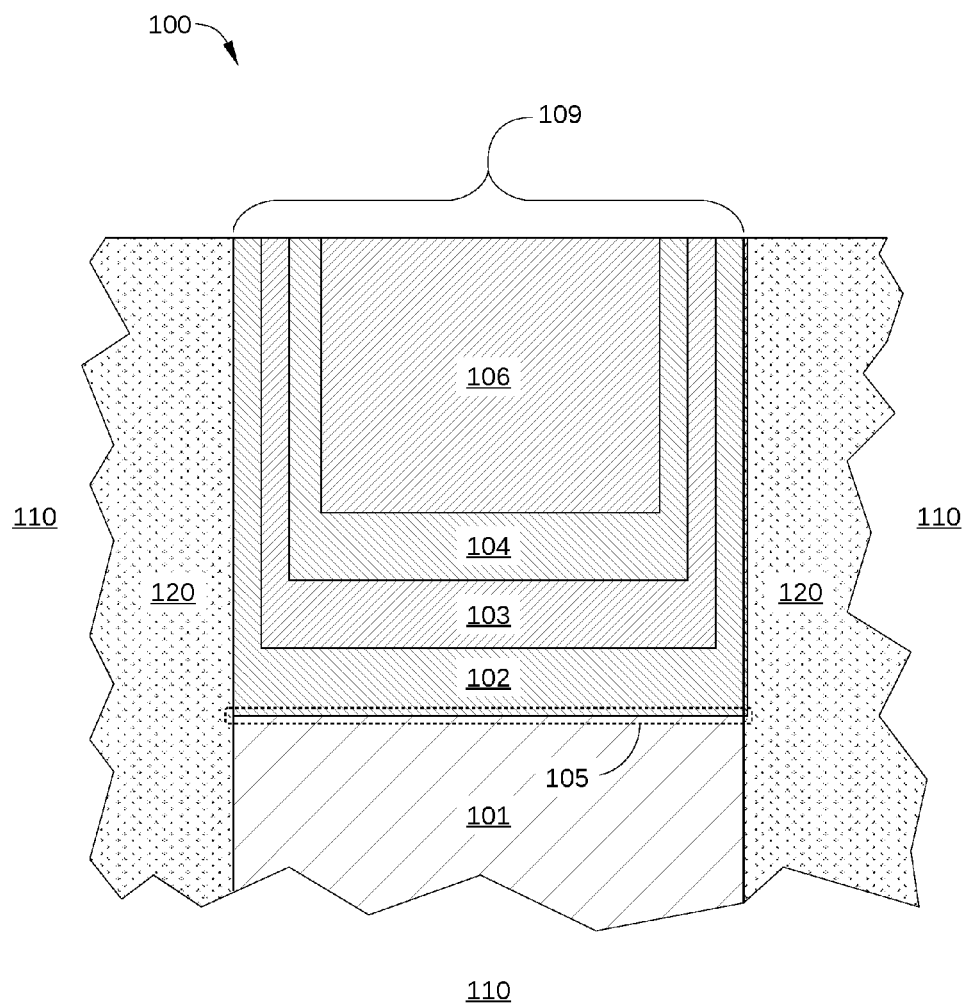
FIG. 1 illustrates a cross-sectional view of a contact structure formed on substrate as part of a semiconductor device, according to an embodiment of the disclosure.

FIG. 1 illustrates a cross-sectional view of a conductive structure 100 formed on a semiconductor substrate 110 as part of a semiconductor device, according to an embodiment of the disclosure. Conductive structure 100 may be any portion of a semiconductor device that is configured to conduct electrical current, and therefore benefits from reduced electrical resistance. In the embodiment illustrated in FIG. 1, conductive structure 100 is depicted as a contact structure for providing electrical contact to a source or drain structure 101, and is shown after conductive structure 100 has been formed and a planarization process, such as chemical-mechanical polishing (CMP), has been completed on semiconductor substrate 110. For example, conductive structure 100 may be a contact structure for a field-effect transistor (FET).

Conductive structure 100 is disposed in a contact well 109, which is a cavity formed in insulating material 120. Insulating material 120, alternatively referred to as shallow trench isolation (STI), may include one or more dielectric materials, such as silicon dioxide ($SiO_2$), silicon nitride ($Si_3N_4$), or multiple layers thereof. Insulating material 120 may be formed by high-density plasma (HDP), flowable chemical vapor deposition (FCVD), tetraethyl orthosilicate (TEOS), or the like. Conductive structure 100 may include a stack of multiple metal layers, for example, a first metal layer 102, a metal nitride layer 103, and at least a conductive portion disposed over the first metal layer 102 and the metal nitride layer 103. The conductive portion may include a capping layer 104 and/or a conductive layer 106.

Source or drain structure 101 may be formed from semiconductor substrate 110 or from a different semiconductor material that is deposited on semiconductor substrate 110. In the latter case, the different semiconductor material may include silicon-germanium, a III-V compound semiconductor material, or the like. For example, in some embodiments, an epitaxial process may be performed to grow source or drain structure 101.

First metal layer 102 is formed on source or drain structure 101, and includes one or more metals selected to form, after a suitable thermal anneal process, a silicide 105 at the interface with source or drain structure 101. For example, in some embodiments, first metal layer 102 includes titanium (Ti) or is wholly composed of Ti, and may have a thickness of about 40 Å to about 50 Å. Metal nitride layer 103 is formed on first metal layer 102, and includes a metal nitride, for example to act as a diffusion barrier layer in conductive structure 100. In some embodiments, metal nitride layer 103 includes titanium nitride (TiN), tantalum nitride (TaN), and/or tungsten nitride ($W_3N_2$), and may have a thickness of about 10 Å to 20 Å. Capping layer 104 is formed on metal nitride layer 103, typically after the thermal anneal process by which silicide 105 is formed in conductive structure 100, and includes one or more metals. In some embodiments, the conductive structure 100 can include a separately formed conductive layer 106, which may include a metal such as cobalt, copper, ruthenium, nickel, tungsten, aluminum, or other useful metal, or alloy thereof. In some embodiments, capping layer 104 includes Co, and may have a thickness of about 10 Å to 20 Å. In other embodiments, the capping layer 104 includes a metal (e.g., cobalt), which completely fills the remaining portion of the contact well 109.

As noted previously, the presence of O atoms in first metal layer 102 and/or metal nitride layer 103 deleteriously affects the effective conductivity of conductive structure 100. First, oxides in any metal layer increase the bulk electrical conductivity of the formed metal layer. Second, interfacial oxide, i.e., metal oxide formed at the interface between metal nitride layer 103 and capping layer 104, contributes to poor adhesion between metal nitride layer 103 and capping layer 104, potentially resulting in voids that significantly reduce the effective cross-sectional area of conductive structure 100. Unfortunately, low concentrations of O atoms are almost always present to some degree in the bulk portions of the metal layers of conductive structure 100. Furthermore, in many case, oxides can form at higher concentrations on metal surfaces that are exposed to air between fabrication steps. According to embodiments of the disclosure, the presence of bulk and interfacial O atoms in conductive structure 100 can be reduced via a sequential hydrogenation and plasma nitridization process. A physical model for how such a sequential process reduces bulk and interfacial O atoms in conductive structure 100 is illustrated in FIGS. 2A-E and 3A-D.

Physical Model of Reducing Interfacial and Bulk Oxygen

FIGS. 2A-2E are schematic views of metal nitride layer 103 within contact structure 100 at various stages of the fabrication of contact structure 100, according to an embodiment of the disclosure. It is noted that FIGS. 2A-2E only illustrate one possible surface termination of metal nitride layer 103, and is merely representative of a typical TiN structure. In some embodiments, metal nitride layer 103 may have any other possible surface termination or crystalline structure associated with a TiN layer.

Figure 2A:
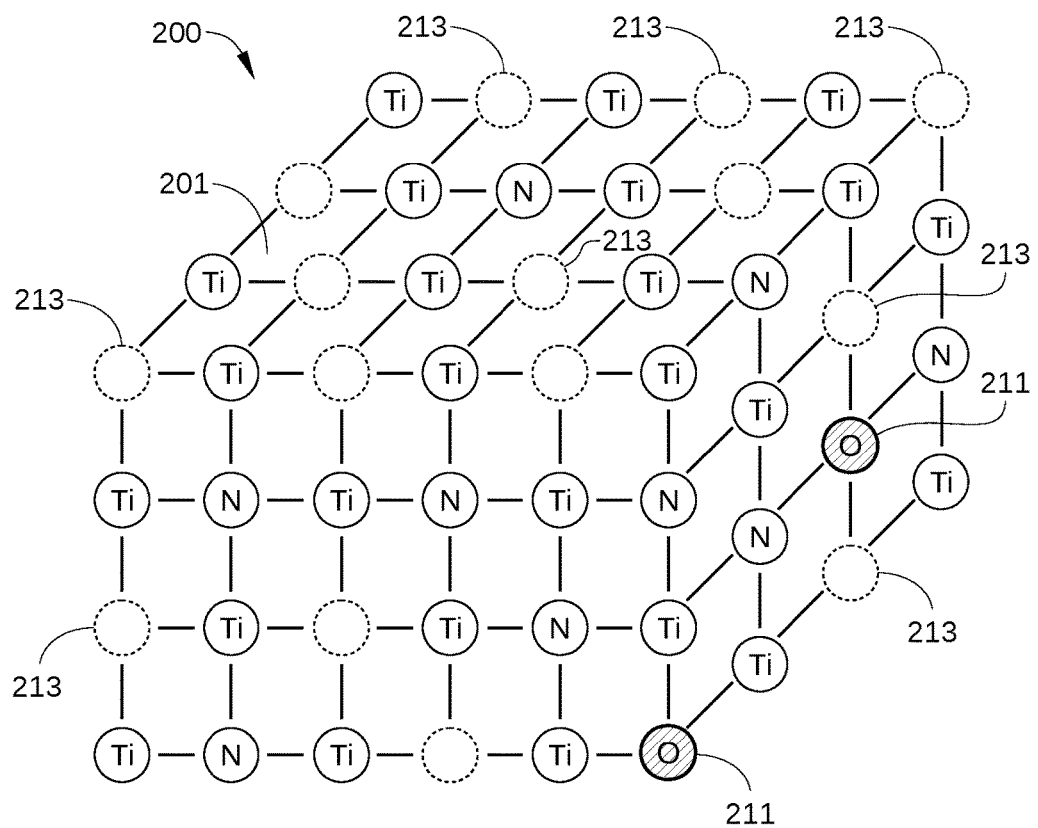
FIGS. 2A-2E are schematic views of a metal nitride layer within the contact structure of FIG. 1 at various stages of the fabrication of the contact structure, according to an embodiment of the disclosure.

In FIG. 2A, a portion 200 of metal nitride layer 103 is schematically illustrated immediately after metal nitride layer 103 has been deposited on first metal layer 102, and prior to portion 200 being exposed to air. Portion 200 includes a surface 201 of portion 200 that will ultimately have capping layer 104 deposited thereon. As shown, portion 200 has an NaCl cubic structure, and is primarily made up of Ti and N atoms. In addition, portion 200 includes a low concentration of bulk O atoms 211 (cross-hatched), typically disposed in a bulk region of portion 200 below surface 201. The bulk O atoms 211 may be incorporated by contamination found in the processing environment during the deposition process used to form portion 200. Further, portion 200 generally includes vacancies 213, which are sites within the crystal lattice of portion 200 where an atom is missing. Vacancies 213 are locations at which additional oxidation within portion 200 may take place when nitride layer 103 is exposed to air. It is noted that when metal nitride layer 103 is formed by an atomic layer deposition (ALD) process, vacancies 213 are relatively common due to the film nucleation and growth mechanisms found in an ALD process versus a traditional chemical vapor deposition (CVD) or physical vapor deposition (PVD) process. Thus one or more of the embodiments of the disclosure provide herein may provide significant benefits when used on films formed by an ALD process versus conventional PVD or CVD type processes.

Figure 2B:
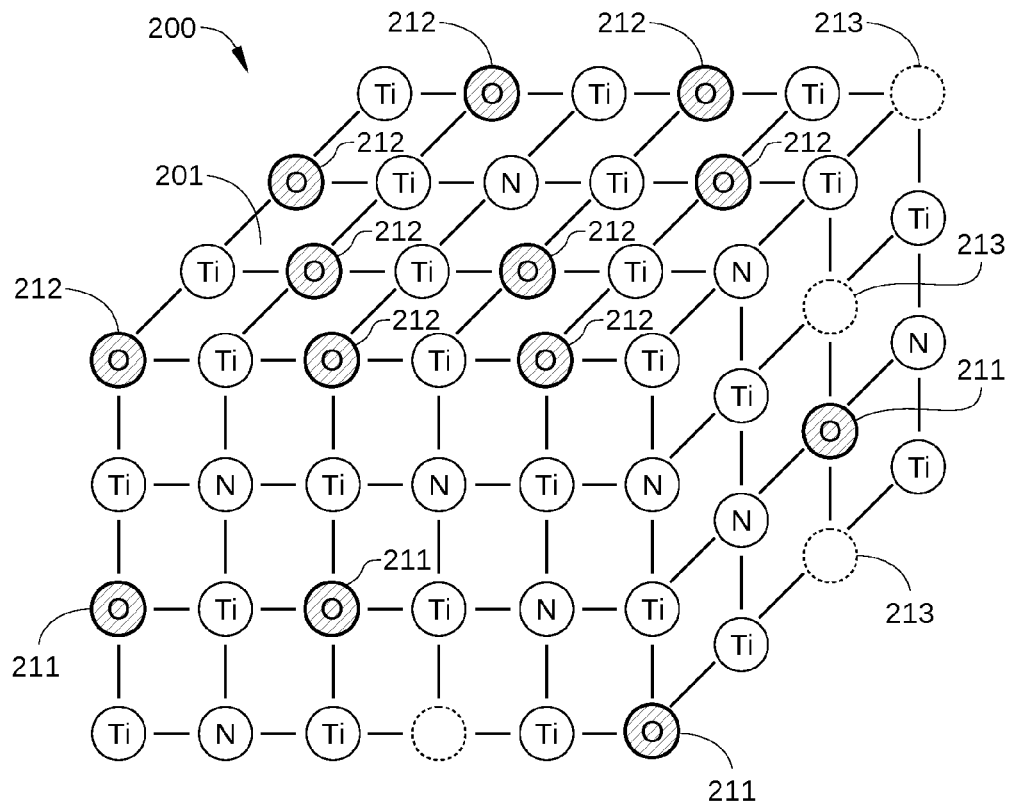

In FIG. 2B, portion 200 is illustrated after being removed from the processing system that deposited metal nitride layer 103. For example, semiconductor substrate 110 on which portion 200 is formed may be exposed to air in preparation for a thermal anneal process. Typically, conventional thermal processing chambers, such as anneal process chambers, are performed in different processing systems from the processing systems that are used to form the first metal layer 102 and metal nitride layer 103, due to a difference in the required cleanliness, thermal management control and vacuum level requirements needed to form most advanced device nodes applications today. Thus, in FIG. 2B, portion 200 is illustrated after being exposed to air. As shown, surface 201 has been partially oxidized, with surface O atoms 212 occupying most or all of the vacancies 213 disposed on surface 201. In some cases, some of the vacancies 213 disposed within portion 200 are occupied with bulk O atoms 211 as a result of exposure of portion 200 to air.

Figure 2C:
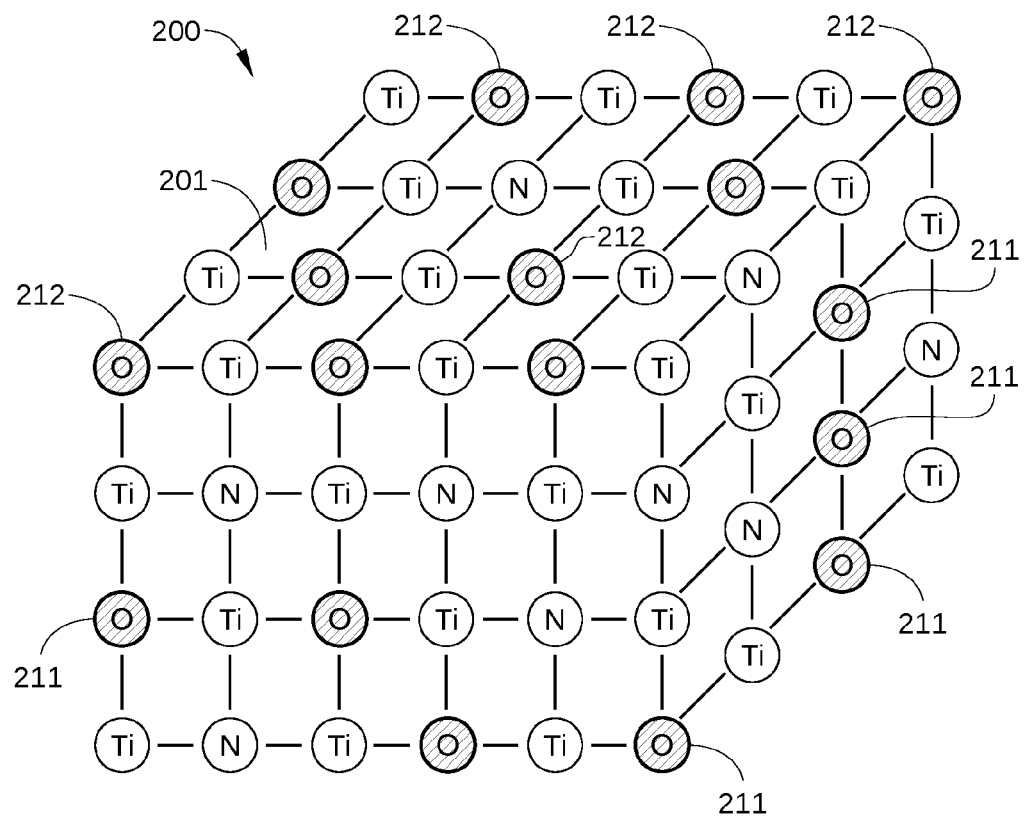

In FIG. 2C, portion 200 is illustrated after undergoing a thermal anneal process to form silicide 105 as shown in FIG. 1. Some or all of the remaining vacancies 213 are filled with bulk O atoms 211 or surface O atoms 212. In some embodiments, bulk O atoms 211 may also displace a portion of the N atoms disposed within portion 200. Thus, the anneal process generally increases the number of both bulk O atoms 211 and surface O atoms 212 in portion 200. Even when the depth of surface O atoms 212 on surface 201 is only one or two monolayers, the effect on resistivity of conductive structure 200 can be significant, particularly for smaller device structures, such as those associated with the advanced device nodes (e.g., 65 nm technology node and below).

Figure 2D:
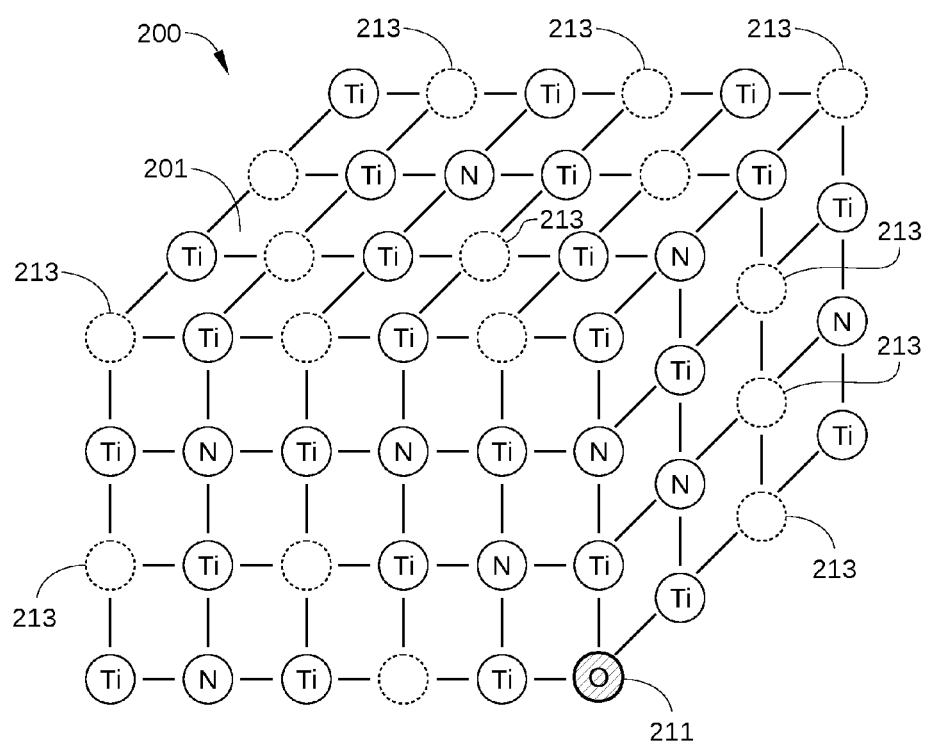

In FIG. 2D, portion 200 is illustrated after being exposed to hydrogen atoms that react with bulk O atoms 211 and/or surface O atoms 212 included in portion 200, according to various embodiments of the disclosure. In some embodiments, bulk O atoms 211 and/or surface O atoms 212 react with hydrogen atoms from thermally disassociated hydrogen gas ($H_2$) as part of a thermal hydrogenation process, whereas in other embodiments, bulk O atoms 211 and/or surface O atoms 212 react with hydrogen atoms from a hydrogen-containing plasma as part of a plasma hydrogenation process.

The thermal hydrogenation process may be performed in a suitable rapid thermal processing chamber under certain processing conditions, including the heating of portion 200 to at least about 550° C. to about 650° C. The plasma hydrogenation process may be performed in a suitable plasma processing chamber under certain processing conditions. An exemplary plasma processing chamber and plasma processing conditions are each described below for the plasma hydrogenation process. As shown, the hydrogenation process reduces or otherwise removes all or substantially all of the surface O atoms 212 from surface 201, leaving vacancies 213 behind. Moreover, the plasma hydrogenation process may also remove some or all bulk O atoms 211 disposed below surface 201.

Figure 2E:
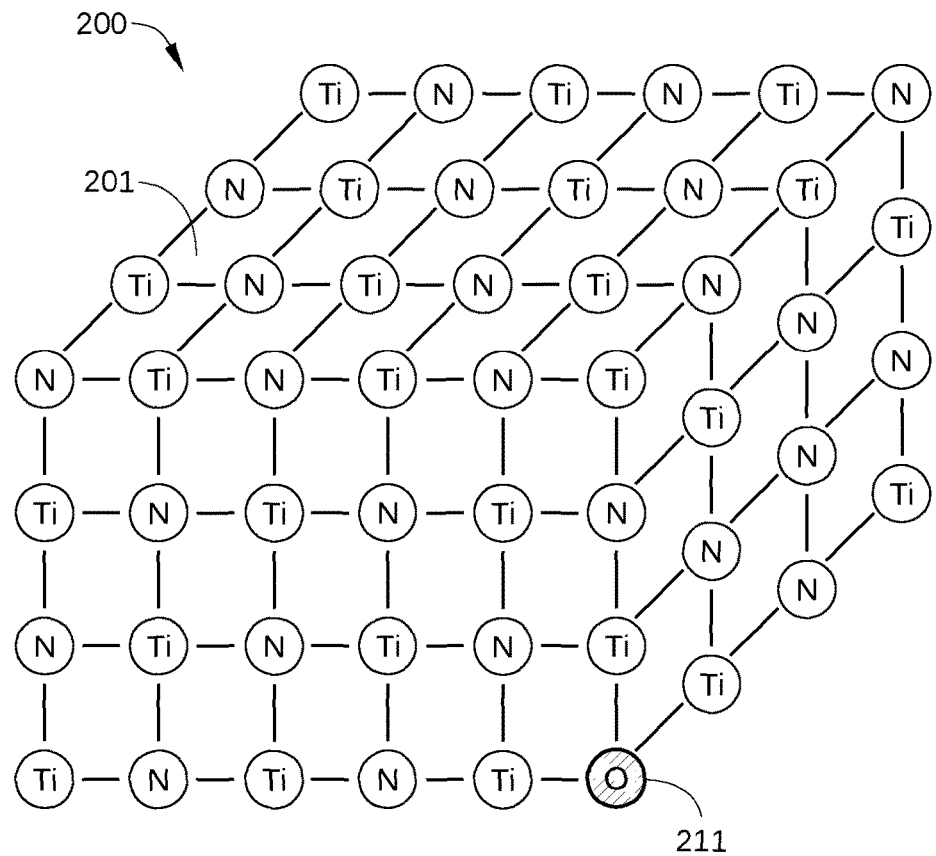

In FIG. 2E, portion 200 is illustrated after undergoing a plasma nitridization process, according to various embodiments of the disclosure. The plasma nitridization process may be performed in a suitable plasma processing chamber under certain processing conditions, and an exemplary plasma processing chamber and plasma processing conditions are each described below for the plasma nitridization process. In some embodiments, the plasma nitridization process may be performed in the same plasma processing chamber that performs the plasma hydrogenation process. In addition, no air break occurs between the plasma or thermal hydrogenation process and the plasma nitridization process. That is, portion 200 is not exposed to air after the plasma or thermal hydrogenation process and before the plasma nitridization process.

As shown, the nitridization process causes vacancies 213 to be filled with N atoms, so that surface 201 has very little or no surface O atoms 212 disposed thereon. Consequently, surface 201 may be saturated with N atoms and, as a result, subsequent oxidation of surface 201 is greatly reduced or eliminated, even when surface 201 is again exposed to air prior to deposition of capping layer 104. Therefore, adhesion between surface 201 of the metal nitride layer 103 and capping layer 104 is improved. In addition, some or all vacancies below surface 201 may be filled with N atoms instead of bulk O atoms 211, further improving the electrical conductivity of metal nitride layer 103, first metal layer 102, and conductive structure 100 as a whole.

Figure 3:
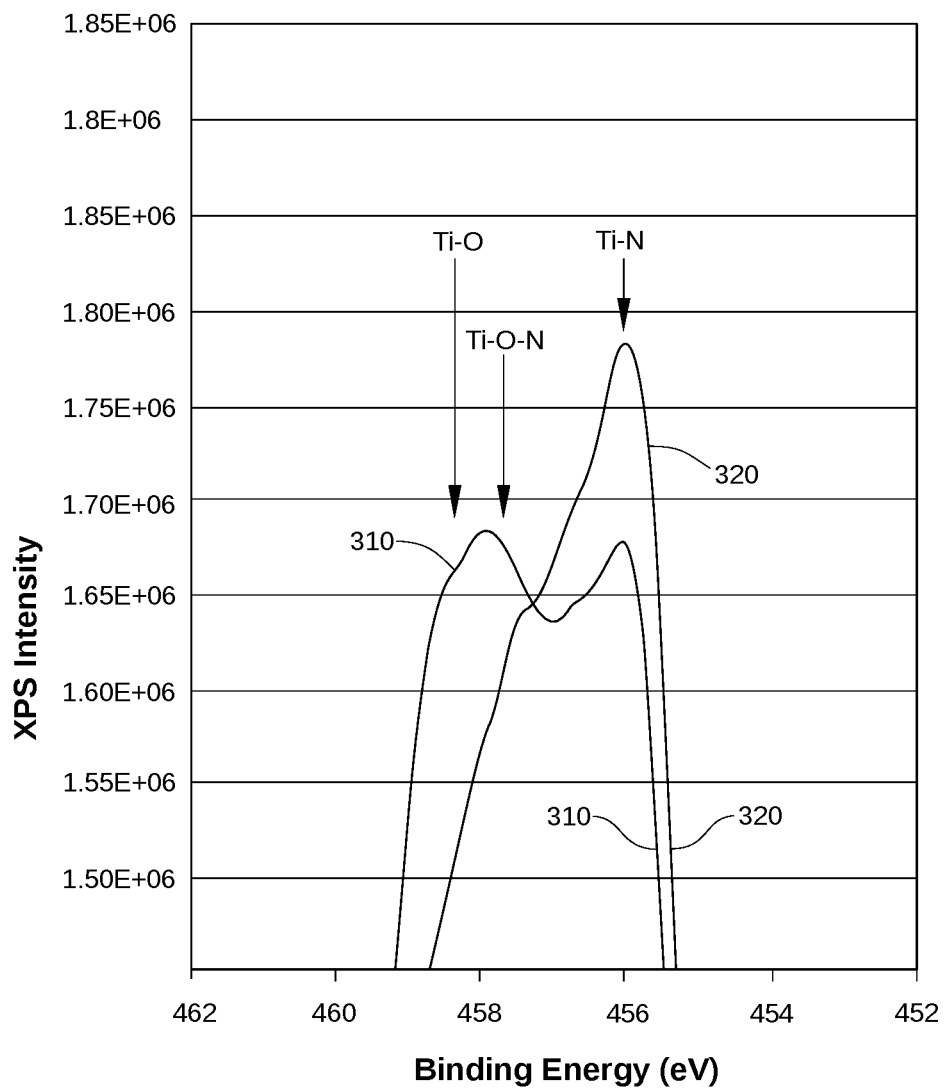
FIG. 3 is a graph of an X-ray Photoelectron Spectroscopy (XPS) spectrum 310 for a deposited and thermally annealed TiN film prior to treatment and an XPS spectrum 320 for the same deposited and thermally annealed TiN film after treatment, according to an embodiment of the disclosure.

FIG. 3 is a graph of an X-ray Photoelectron Spectroscopy (XPS) spectrum 310 for a deposited and thermally annealed TiN film prior to treatment and an XPS spectrum 320 for the same deposited and thermally annealed TiN film after treatment, according to an embodiment of the disclosure. The treatment includes a plasma or thermal hydrogenation process followed by a plasma nitridization process. The thermal anneal process is a rapid thermal process in a nitrogen gas ($N_2$) or ammonium ($NH_3$) environment, at temperatures between about 550 and 600. The plasma hydrogenation process is performed in an inductively coupled plasma (ICP) chamber on a substrate pedestal at a temperature between about 350° C. and 500° C., a process pressure of between about 10 mT and 150 mT, a plasma power of between about 250 W and 2000 W, an $H_2$ flow rate of between about 5 sccm and 100 sccm, and an argon (Ar) flow rate of between about 250 sccm and 2000 sccm, for a duration of between about 30 seconds and about 200 seconds. The plasma nitridization process can be performed in the same ICP chamber, on a substrate pedestal at a temperature between about 350° C. and 500° C., a process pressure of between about 10 mT and 100 mT, a plasma power of between about 250 W and 2000 W, an $NH_3$ flow rate of between about 5 sccm and 100 sccm, a nitrogen ($N_2$) flow rate of between about 20 sccm and 500 sccm, and an argon (Ar) flow rate of between about 250 sccm and 2000 sccm, for a duration of between about 30 seconds and about 200 seconds.

As is well-known in the art, an XPS spectrum of a TiN film may include multiple peaks, each indicating a different relative concentration of different titanium-containing materials. For example, a Ti—O peak at a binding energy of approximately 458.5 eV generally indicates the presence of Ti—O bonds and, therefore, the presence of O atoms in the titanium-containing material; a Ti—O—N peak at a binding energy of approximately 457 eV generally indicates the presence of Ti—O—N bonds and, therefore, the presence of N atoms and O atoms in the titanium-containing material; and a Ti—N peak at a binding energy of approximately 454.9 eV generally indicates the presence of Ti—N bonds and, therefore, the presence of nitrogen (N) atoms in the titanium-containing material.

XPS spectrum 310 is associated with the Ti 2p shell for a deposited TiN film after the above-described thermal anneal process is performed thereon, and XPS spectrum 320 is associated with the Ti 2p shell for the deposited and thermally annealed TiN film after undergoing the above-described plasma hydrogenation process followed by the above-described plasma nitridization process. As shown, the peak indicating the presence of Ti—O bonds and the peak indicating the presence of Ti—O—N bonds are significantly lower in XPS spectrum 320 than in XPS spectrum 310, clearly indicating a reduction in the presence of O atoms in the TiN film. Furthermore, the peak indicating the presence of Ti—N bonds is significantly higher in XPS spectrum 320 than in XPS spectrum 310, clearly indicating an increase in the concentration of N atoms in the TiN film. Thus, by performing the hydrogenation and nitridization processes after an anneal process, the concentration of O atoms in metal nitride film 103 can be significantly reduced and the concentration of N atoms in metal nitride film 103 can be significantly increased.

FIGS. 2A-2E and FIG. 3 illustrate the effect of post-anneal sequential hydrogenation and nitridization process on metal nitride layer 102. In some embodiments, employing a plasma or thermal hydrogenation process followed by a plasma nitridization process on portion 200 prior to a thermal anneal process can have similar beneficial effects. Specifically, because surface 201 may be mostly or completely saturated with N atoms due to the plasma nitridization process (as shown in FIG. 2E), the subsequent air exposure and thermal anneal of surface 201 results in very little or no oxidation. As a result, the concentration of bulk O atoms 211 found in portion 200 and the concentration of surface O atoms 212 on surface 201 is not significantly increased.

System Overview for Sequential Hydrogenation and Nitridization

Figure 4:
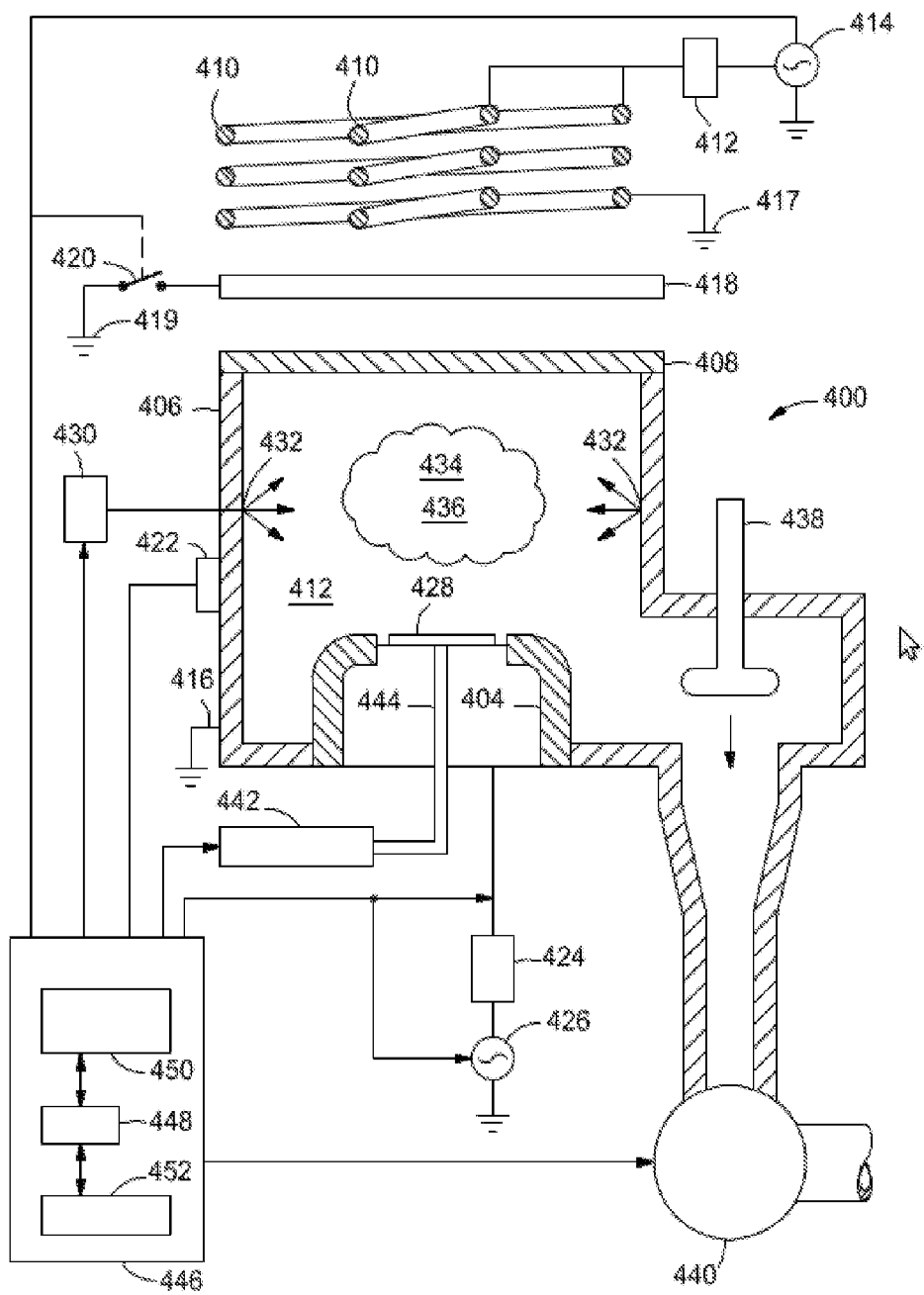
FIG. 4 is a cross-sectional side view of a processing chamber configured to implement one or more aspects of the present disclosure.

FIG. 4 is a schematic cross sectional view of a plasma processing chamber 400 configured to implement one or more aspects of the present disclosure. Plasma processing chamber 100 may be any suitable plasma processing chamber, such as an inductively coupled plasma (ICP) processing chamber. As shown in FIG. 4, processing chamber 400 may include a chamber wall 406, a chamber lid 408 and a substrate support pedestal 404 disposed within the chamber wall 406. Typically, chamber wall 406 is coupled to an electrical ground 416. Chamber lid 408 may be composed of any suitable dielectric, such as quartz. For some embodiments, dielectric lid 408 may assume a different shape (e.g., dome-shaped). In some embodiments, chamber lid 408 may be coated with a ceramic coating, such as an yttrium containing oxide, for protection from plasma species. In one embodiment, the ceramic coating is a high performance material (HPM) that is composed of a compound $Y_4Al_2O_9$ and a solid solution $Y_{2-x}Zr_xO_3$ ($Y_2O_3$—$ZrO_2$ solid solution). The ceramic coating may have a thickness ranging from about 100 microns to about 300 microns, such as about 200 microns.

Above chamber lid 408, a radio frequency (RF) antenna including at least one inductive coil element 410 may be disposed (two coaxial coil elements are shown). In some embodiments, inductive coil elements 410 may be disposed around at least a portion of chamber wall 406. One end of inductive coil element 410 may be coupled, through a first impedance matching network 412, to an RF power source 414, and the other end may end may be connected to an electrical ground 417 as shown. Power source 414 is typically capable of producing up to 10 kilowatts (kW) at a tunable frequency in a range from 2 to 160 MHz, with 13.56 MHz being a typical operating frequency. The RF power supplied to inductive coil elements 410 may be pulsed (i.e., switched between an on and an off state) or power cycled (i.e., varying a power input from a high level to a low level) at a frequency ranging from 1 to 100 kHz.

Interposed between inductive coil elements 410 of the RF antenna and chamber lid 408 may be a shielding electrode 418. Shielding electrode 418 may be alternately electrically floating or coupled to an electrical ground 419 via any suitable means for making and breaking an electrical connection, such as a switch 420 as illustrated in FIG. 4.

For some embodiments, a detector 422 may be attached to chamber wall 406 to facilitate determining when a gas mixture within chamber 400 has been energized into plasma. Detector 422 may, for example, detect the radiation emitted by the excited gases or use optical emission spectroscopy (OES) to measure the intensity of one or more wavelengths of light associated with the generated plasma.

Pedestal 404 may be coupled, through a second impedance matching network 424, to a biasing power source 426. Biasing power source 426 is generally capable of producing an RF signal having a tunable frequency ranging from 2 to 160 MHz and power between 0 and 10 kW, similar to RF power source 414. Optionally, biasing power source 426 may be a direct current (DC) or pulsed DC source.

In operation, a substrate 428, such as a semiconductor substrate, may be placed on pedestal 404, and process gases may be supplied from a gas panel 430 through entry ports 432 in an effort to form a gaseous mixture 434. Typical process gases that may be used in one or more of the processes described herein are described below. Entry ports 432 may be coated with the ceramic coating, such as HPM. Gaseous mixture 434 may be energized into a plasma 436 in processing chamber 400 by applying power from RF power source 414. The pressure within the interior of processing chamber 400 may be controlled using a throttle valve 438 and a vacuum pump 440. In some embodiments, the temperature of chamber wall 406 may be controlled using liquid-containing conduits (not shown) that run through chamber wall 406 or heating elements embedded in chamber wall 406 (e.g., heating cartridges or coils) or wrapped around processing chamber 400 (e.g., heater wrap or tape).

The temperature of substrate 428 may be controlled by stabilizing the temperature of pedestal 404. In some embodiments, helium (He) gas from a gas source 442 may be provided via a gas conduit 444 to channels (not shown) formed in the pedestal surface under substrate 428. The helium gas may facilitate heat transfer between pedestal 404 and substrate 428. During processing, pedestal 404 may be heated to a steady state temperature, and then the helium gas may facilitate uniform heating of the substrate 428. Pedestal may be so heated by a heating element (not shown), such as a resistive heater embedded within pedestal 404, or a lamp generally aimed at pedestal 404 or substrate 428 when thereon. Using such thermal control, substrate 428 may be maintained at a temperature between about 20 to 350 degrees Celsius (° C.).

In order to allow for control of the components of processing chamber 400 as described herein, a controller 446 may be provided. Controller 446 may comprise a central processing unit (CPU) 448, a memory 450, and support circuits 452 for CPU 448. Controller 446 may interface with RF power source 414, switch 420, detector 422, and biasing power source 426.

Controller 446 may be any suitable type of general-purpose computer processor that can be used in an industrial setting for controlling various chambers and sub-processors. Memory 450, or other computer-readable medium, for CPU 448 may be one or more of any readily available memory forms, such as random access memory (RAM), read only memory (ROM), a floppy disk, a hard disk, or any other form of digital storage, local or remote. Support circuits 452 may be coupled to CPU 448 in an effort to support the processor in a conventional manner. These circuits may include cache, power supplies, clock circuits, input/output (I/O) circuitry and subsystems, and the like. For some embodiments, the techniques disclosed herein for energizing and maintaining a plasma may be stored in memory 450 as a software routine. The software routine may also be stored and/or executed by a second CPU (not shown) that is remotely located from the hardware being controlled by CPU 448.

According to some embodiments of the disclosure, a thermal or plasma hydrogenation process, followed by a plasma nitridization process, hereinafter referred to as a "sequential hydrogenation/nitridization process," is performed on a substrate prior to and/or after a thermal anneal is performed on the substrate. The sequential hydrogenation/nitridization process may include a capacitively coupled plasma process or an inductively coupled plasma process. In some embodiments, plasma for the hydrogenation/nitridization process may be formed in a remote plasma source outside of processing chamber 400, and in other embodiments, the plasma for the plasma process may be formed in-situ, i.e., in processing chamber 400.

In the plasma hydrogenation process, plasma-excited H radicals and/or ions react with bulk O atoms 211 and/or surface O atoms 212 to create vacancies 213. In the case of a thermal hydrogenation process, disassociated H atoms react with bulk O atoms 211 and/or surface O atoms 212 to create vacancies 213. In the nitridization process, N radicals and/or ions occupy vacancies 213.

It is noted that during the plasma hydrogenation process, a processing environment within processing chamber 400 generally includes a relatively low lower concentration of O atoms due to the presence of H atoms, such as disassociated H atoms, H radicals, and/or H ions. Thus, the processing environment within processing chamber 400 during the plasma hydrogenation process may include a lower concentration of O atoms than the processing environment within processing chamber 400 during the nitridization process or in a processing environment within a processing chamber during the deposition of a metal nitride layer. However, for both hydrogenation or nitridization, a lower concentration of O atoms is generally advantageous. Thus, in some embodiments, a processing chamber may be conditioned with a plasma process, such as an $H_2$ process, prior to the plasma hydrogenation process and/or the nitridization process, to remove any traces of O species.

When a metal nitride layer to be treated with the herein described hydrogenation/nitridization process is a thin film with a thickness of about 200 Å or less, an ICP process is generally less likely to damage the metal nitride layer, either during hydrogenation or nitridization. Specifically, in an ICP process the plasma sheath is typically smaller than that in a CCP chamber, and therefore ions traveling therethough typically have proportionally less energy, for example on the order of 10s of eV, such as 10 to 20 eV. By contrast, ions in a CCP chamber typically have energies on the order of 100s of eVs (e.g., >200-400 eV), and consequently can create significant damage to the metal nitride layer. Furthermore, an ICP process can provide more oxygen removal from a metal nitride layer than by use of a CCP or remote plasma process, due to the higher density of ions, radicals, and other plasma-excited species generally formed in the an ICP processing chamber and in proximity to the substrate versus CCP and remote plasma sources used in other types of processing chambers. In comparison, a concentration of radicals from CCP and remote plasma sources are relatively low.

In embodiments in which the plasma for the plasma process is formed in-situ, the plasma may be formed via inductive coil elements 410, first impedance matching network 412, RF power source 414, and, in some embodiments, second impedance matching network 424 and biasing power source 426. In such embodiments, the plasma process may include the introduction of one or more process gases into processing chamber 400 that are selected to generate certain plasma species (i.e., ions, neutral atoms, and/or radicals). More specifically, in the case of the plasma hydrogenation process, the one or more process gases are selected to generate plasma-excited hydrogen species, while in the case of the plasma nitridization process, the one or more process gases are selected to generate plasma-excited nitrogen species. Thus, for the plasma hydrogenation process, the one or more process gases may include hydrogen ($H_2$), and/or ($D_2$) and for the plasma nitridization process, the one or more process gases may include nitrogen ($N_2$), ammonia ($NH_3$). Alternatively or additionally, the plasma process may include the introduction of one or more carrier and/or inert gases into processing chamber 400, such as argon (Ar). In some embodiments, the plasma hydrogenation process primarily includes the formation of a plasma that includes a process gas that essentially consists of hydrogen ($H_2$), which forms the reactive species provided from the plasma. One will note that the formation of hydrogen containing species using a plasma (e.g., inductively coupled plasma) that is formed using $H_2$, will have significantly more hydrogen containing radicals and ions than a thermal hydrogenation process that uses a $H_2$ containing process gas, thus improving the effectiveness of the plasma hydrogenation process and reducing unwanted reactions found when using non-pure hydrogen containing reactive gases.

In some embodiments, the one or more process gases are energized by an RF power source, such as RF power source 414. The RF power may be pulsed at between 2% to 70% duty cycle and may range from about 100 W to about 2500 W. The RF power may be a continuous wave ranging from about 100 W to about 2500 W. The process chamber may have a chamber pressure ranging from about 10 mT to about 200 mT during the plasma process, while the process temperature, for example the temperature of pedestal 404, may range from 20° C. to about 500° C.

In an exemplary embodiment, a plasma hydrogenation process is performed at a process temperature that is between about 400° C. and about 500° C., a chamber pressure that is between about 5 mT and about 20 mT, an RF power that is between about 1000 W and about 2000 W, and a biasing voltage that is between about 175 V and about 250 V, with an $H_2$ flow that is between about 20 sccm and about 40 sccm and an Ar flow that is between about 400 sccm and about 500 sccm for a period of time of between about 50 seconds and about 300 seconds. Plasma-excited hydrogen species generated from the plasma inside process chamber 400 can reduce some or all oxides present on the exposed surface of a metal nitride layer (e.g., metal nitride layer 103) of a partially formed conductive structure (e.g., conductive structure 100). In some embodiments, the plasma-excited hydrogen species can also reduce some or all O atoms present in the bulk material of a metal nitride layer or other metal layers of the conductive structure, such as first metal layer 102 of conductive structure 100. Such reduction of O atoms is described above in conjunction with FIGS. 2D and 3B.

In another exemplary embodiment, a plasma nitridization process is performed at a process temperature that is between about 400° C. and about 500° C., a chamber pressure that is between about 5 mT and about 25 mT, an RF power that is between about 1000 W and about 2000 W, and a biasing voltage that is between about 175 V and about 250 V, with an $NH_3$ flow that is between about 20 sccm and about 40 sccm, an $N_2$ flow that is between about 400 sccm and about 600 sccm, and an Ar flow that is between about 400 sccm and about 500 sccm for a period of time of between about 50 seconds and about 300 seconds. Plasma-excited nitrogen species generated from the plasma inside process chamber 400 can saturate an exposed surface of a metal nitride layer (e.g., surface 201 of metal nitride layer 103) of a partially formed conductive structure. In some embodiments, the plasma-excited nitrogen species can also fill vacancies present in the bulk material of a metal nitride layer or other metal layers of the conductive structure. Such nitridization is described above in conjunction with FIGS. 2E and 3C.

In embodiments in which the plasma for the plasma process is formed remotely, the plasma may be formed via any technically feasible remote plasma source. In such embodiments, the plasma process may include the introduction of one or more process gases into the remote plasma source that are selected to generate plasma-excited hydrogen species or plasma-excited nitrogen species. Alternatively or additionally, the remote plasma process may include the introduction of one or more carrier and/or inert gases into the remote plasma source such as argon (Ar). The remotely generated plasma species then flow into processing chamber 400, and process a metal nitride layer of a conductive structure formed on a substrate disposed in processing chamber 400. As described above, depending on whether the plasma species are plasma-excited hydrogen species or plasma-excited nitrogen species, interfacial and bulk O atoms in the metal nitride layer are reduced, or nitridization of the metal nitride layer is enhanced.

In some embodiments, rather than a plasma hydrogenation process, a thermal hydrogenation process may be employed to expose a metal nitride layer to hydrogen atoms. In such embodiments, the thermal hydrogenation process generally occurs at an elevated temperature, for example between about 500° C. and about 650° C. At such elevated temperatures, $H_2$ gas dissociates into individual atoms, which can then react with O atoms in metal nitride layer 103 and generate vacancies 213. Furthermore, in such embodiments, the thermal hydrogenation process is generally performed in a different processing chamber than processing chamber 400. For example, in some embodiments, the thermal hydrogenation process is performed in a rapid thermal processing chamber. In such embodiments, a salicidation process may be performed concurrently with the thermal hydrogenation process, thereby eliminating a subsequent anneal process.

In embodiments in which a thermal anneal process is employed to expose a metal nitride layer to hydrogen atoms, the plasma nitridization process is performed without an air break that exposes metal nitride layer 103 to air. For example, in such embodiments, one chamber of a multi-chamber processing system can be configured to perform the thermal hydrogenation process, and another chamber of the same multi-chamber processing system can be configured to perform the plasma nitridization process. Thus, a substrate on which metal nitride layer 103 is formed can undergo the thermal hydrogenation process, then be directly transferred to the plasma nitridization chamber without exposure to air.

Figure 5:
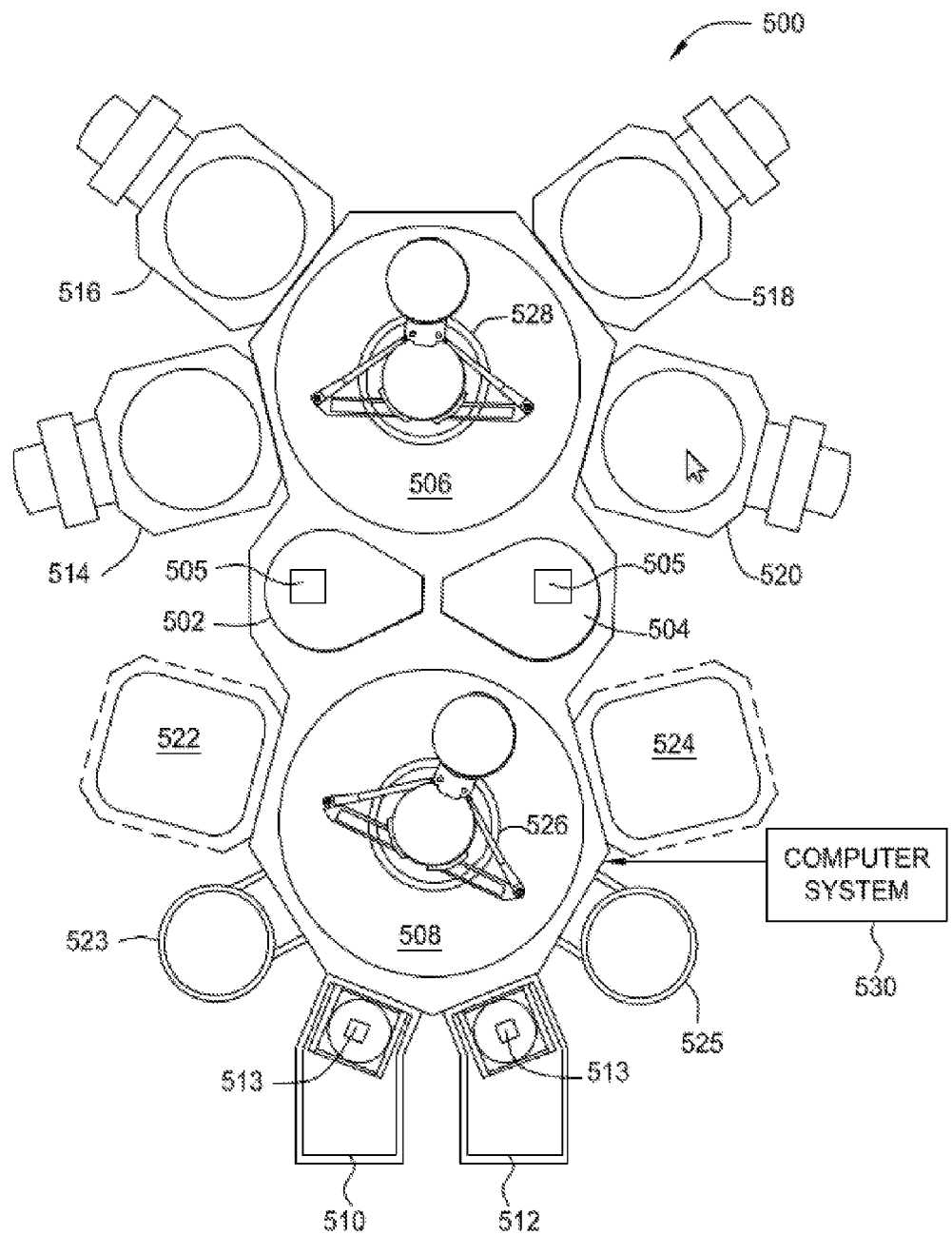
FIG. 5 is a top plan view of a multi-chamber processing system configured to implement one or more aspects of the present disclosure.

FIG. 5 is a top plan view of a multi-chamber processing system 500 configured to implement one or more aspects of the present disclosure. Multi-chamber processing system 500 is configured to perform one or more fabrication processes on individual substrates, such as silicon wafers, for forming semiconductor devices. Multi-chamber processing system 500 includes some or all of a transfer chamber 506, a buffer chamber 508, single wafer load locks 510 and 512, processing chambers 514, 516, 518, 520, 522, and 524, preheating chambers 523 and 525, and robots 526 and 528. Single wafer load locks 510 and 512 may include heating elements 513 and are attached to buffer chamber 508. Processing chambers 514, 516, 518, and 520 are attached to transfer chamber 506. Processing chambers 522 and 524 are attached to buffer chamber 508. The operation of multi-chamber processing system 500 is controlled by a computer system 530. Computer system 530 may be any device or combination of devices configured to implement the inventive operations provided herein. As such, computer system 530 may be a controller or array of controllers and/or a general purpose computer configured with software which, when executed, performs the inventive operations. One example of a suitable multi-chamber processing system 500 is the Endura® CL System manufactured by Applied Materials, Inc. of Santa Clara, Calif.

Each of processing chambers 514, 516, 518, 520, 522, and 524 may be configured to perform one or more process steps in the fabrication of a conductive structure in a semiconductor device, such as a contact structure for a field-effect transistor (FET). More specifically, processing chambers 514, 516, 518, 520, 522, and 524 may include one or more metal deposition chambers, surface cleaning and preparation chambers, thermal anneal and/or thermal hydrogenation chambers, and plasma hydrogenation/nitridization chambers.

For example, for a contact structure that includes a Ti—TiN—Co stack formed on a silicon source or drain structure, in some embodiments multi-chamber processing system 500 may be configured to sequentially perform several process steps in the fabrication process of such a conductive structure. In such embodiments, processing chamber 514 may be configured to perform a surface cleaning and preparation process on an exposed surface of the silicon source or drain structure, processing chamber 516 may be configured to sequentially deposit Ti and TiN layers on the prepared silicon source or drain structure, processing chamber 522 and/or 524 may be configured to form a silicide by performing a rapid thermal processing (RTP) or other thermal anneal process on the Ti/TiN layers and source or drain structure, processing chamber 518 may be configured to deposit a Co capping layer on the annealed Ti/TiN layers, and processing chamber 520 may be configured to perform a hydrogenation process followed by a nitridization process before or after the thermal anneal process. Thus, in such embodiments, the complete contact structure can be formed without an air break and the resulting unwanted oxidation of one or more layers of the contact structure.

In alternative embodiments, not all process steps for forming a complete contact structure are performed on a single multi-chamber processing system 500. For example, in some embodiments, multi-chamber processing system 500 may include metal deposition processing chambers, while the thermal anneal silicidation process may be performed on a different substrate processing system. In such embodiments, an air break occurs before the thermal anneal process, and it is known that such an air break can increase the presence of O atoms on an interfacial surface of a metal nitride layer and in the bulk material of the metal nitride layer of the contact structure. However, prior to the air break, a sequential plasma (or thermal) hydrogenation/plasma nitridization process can be performed, since multi-chamber processing system 500 may be configured with both metal deposition chambers and one or more plasma processing chambers. Thus, multi-chamber processing system 500 can be configured to perform a sequential hydrogenation/nitridization process on a substrate after deposition of first metal layer 102 and metal nitride layer 103, but before the substrate is removed from multi-chamber processing system 500 and exposed to air. As discussed above, the nitridization of the exposed surface of metal nitride layer 103 prior to an air break can greatly reduce oxidation of the exposed surface during the air break and during the subsequent thermal anneal process.

In some embodiments, multi-chamber processing system 500 may include one or more thermal anneal and plasma processing chambers. In such embodiments, a sequential hydrogenation and nitrogenation process can be performed after the thermal anneal process, thereby removing O atoms introduced by a pre-anneal air break and by the thermal anneal process itself. Typically, thermal annealing processes are not able to maintain desirably low oxygen levels required for most advanced device nodes, due to the high temperatures that the processing components (e.g., seals, process kit components, pumps, etc.) achieve during thermal processing.

Alternatively or additionally, a sequential hydrogenation/nitridization process can be performed prior to the thermal anneal process. Thus, in such embodiments, interfacial O atoms and O atoms present in the bulk portion of a metal nitride layer can be reduced or eliminated prior to performing the thermal anneal process, even though an air break does not occurs after deposition of metal nitride layer 103 and prior to the thermal anneal process. Therefore, in some configurations, a sequential hydrogenation and plasma nitridization process can be performed prior to a thermal anneal process and also after the thermal anneal process, but before an air break occurs.

In some embodiments, multi-chamber processing system 500 may include one or more metal deposition chambers configured to deposit capping layer 104 and/or conductive layer 106 and one or more plasma processing chambers to perform a sequential hydrogenation and nitridization process. In such embodiments, a sequential hydrogenation and nitridization process can be performed prior to the deposition of a capping layer in a conductive structure, thereby removing interfacial and bulk O atoms introduced by air breaks and by the thermal anneal process for forming silicide 105. It is noted that in such embodiments, no air break occurs between the sequential hydrogenation and nitridization process and the deposition of capping layer 104 and/or conductive layer 106. Thus, in such embodiments, interfacial O atoms and O atoms present in the bulk portion of a metal nitride layer can be reduced or eliminated when an air break occurs between the thermal anneal process and the deposition of capping layer 104.

Reduction of Bulk and Interfacial Oxygen in a Contact Structure

Figure 6:
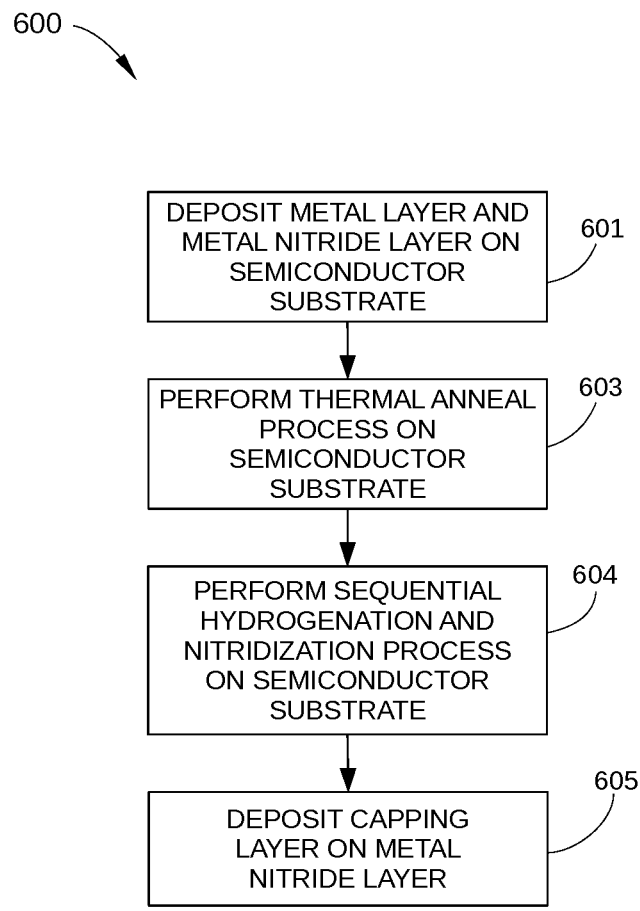
FIG. 6 sets forth a flow chart of process steps for reducing bulk and interfacial oxygen in a contact structure, according to some embodiments of the disclosure.

FIG. 6 sets forth a flow chart of process steps for reducing bulk and interfacial oxygen in a contact structure, according to some embodiments of the disclosure. FIGS. 7A-7E are schematic cross-sectional views of a semiconductor device corresponding to different stages of the process of FIG. 6, according to various embodiments of the disclosure. While FIGS. 7A-7E illustrate first metal layer 102, metal nitride layer 103 and capping layer 104, which fill aperture 109, as being selectively deposited (e.g., layers are not conformally formed over the aperture 109 as shown in FIG. 1), this is not intended to be limiting as to the scope of the disclosure described herein, and thus first metal layer 102, metal nitride layer 103 and capping layer 104 could be formed selectively or non-selectively and include one or more additional layers.

Figure 7A:
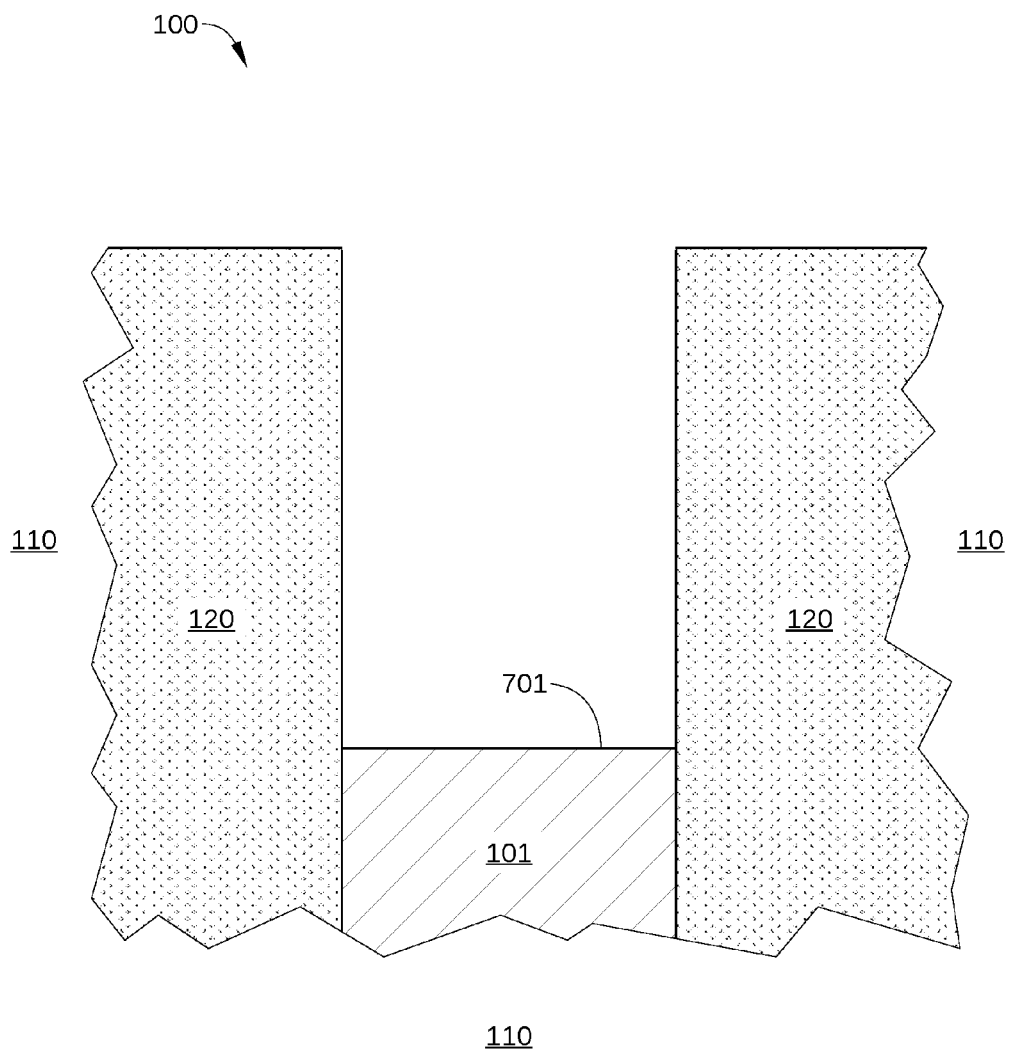
FIGS. 7A-7E are schematic cross-sectional views of a semiconductor device corresponding to different stages of the process of FIG. 6, according to various embodiments of the disclosure.

Prior to step 601, a cleaning process or other surface preparation process may be performed on a surface of the semiconductor substrate on which a contact is to be formed, such as an exposed surface 701 of source or drain structure 101 in FIG. 7A. In some embodiments, a dry-etch process may be performed to remove native oxide on surface 701. For example, a conventional plasma etch, or a remote plasma-assisted dry etch process may be performed, such as a SiCoNi™ etch process, available from Applied Materials, Inc., located in Santa Clara, Calif. In a SiCoNi™ etch process, a surface of the semiconductor substrate on which a contact is to be formed is exposed to $H_2$, $NF_3$, and/or $NH_3$ plasma species, e.g., plasma-excited hydrogen and fluorine species. For example, in some embodiments, such a surface may undergo simultaneous exposure to $H_2$, $NF_3$, and $NH_3$ plasma. The SiCoNi™ etch process may be performed in a SiCoNi™ Preclean chamber, which may be integrated into one of a variety of multi-processing platforms, including the Producer™ GT, Centura™ AP and Endura platform, all available from Applied Materials.

Figure 7B:
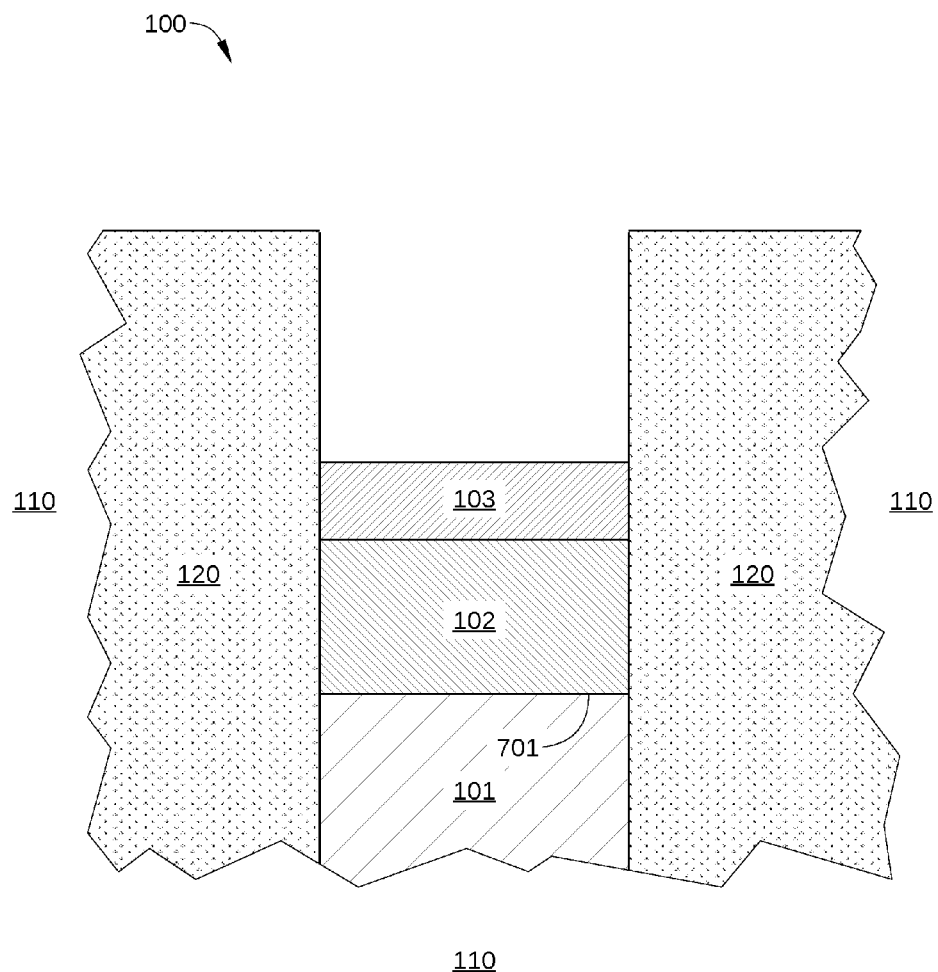

A method 600 begins at step 601, in which first metal layer 102 and metal nitride layer 103 are deposited on the semiconductor substrate, as shown in FIG. 7B. For example, in some embodiments, a Ti layer followed by a TiN barrier layer are deposited. Any suitable PVD, CVD, or ALD process may be employed to perform such deposition. Thus, the deposition process may be a selective process or a non-selective deposition process. In a selective deposition process, first metal layer 102 and metal nitride layer 103 are deposited on surface 701, but not on other surfaces of semiconductor substrate 110, whereas in a non-selective process, first metal layer 102 and metal nitride layer 103 may be deposited on all unmasked surfaces of semiconductor substrate 110. In some embodiments, the deposition of step 601 is performed without an air break after the above-described surface preparation process. That is, the semiconductor substrate is not exposed to atmosphere between the surface preparation process and the deposition of step 601. In such embodiments, the deposition of step 601 and the surface preparation process may each be performed by different chambers on the same multi-chamber processing system, such as multi-chamber processing system 500.

Figure 7C:
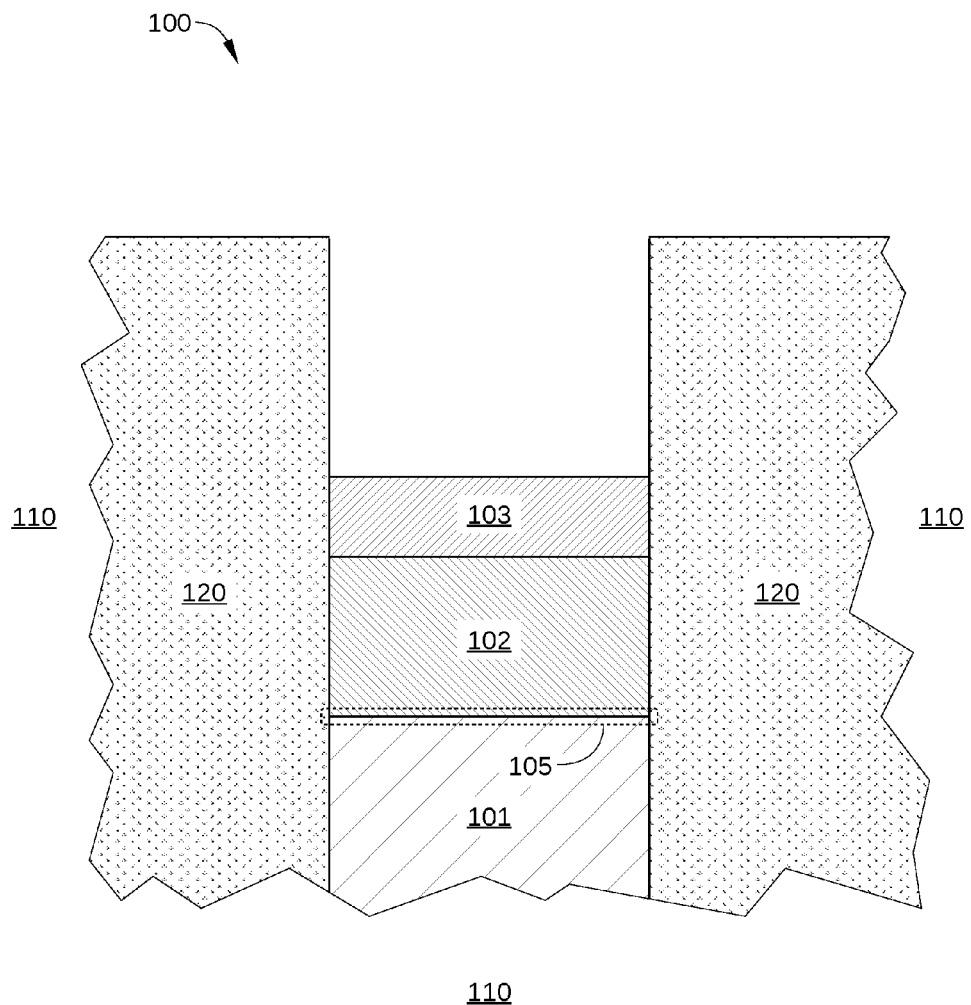

In step 603, a thermal anneal process is performed on semiconductor substrate 110, including first metal layer 102, metal nitride layer 103, and source or drain structure 101. The thermal anneal process forms silicide 105 as shown in FIG. 7C. For example, in some embodiments, a spike anneal process that reaches a peak temperature that is between about 500° C. and about 600° C. may be performed in step 603. Alternatively, any other suitable anneal process may instead be performed to form silicide 105 between source or drain structure 101 and first metal layer 102 deposited in step 601.

In some embodiments, the chamber for performing step 603 may be configured as a chamber of the same multi-chamber processing system that performs the metal deposition of step 601. Thus, in such embodiments, the thermal anneal process of step 603 is performed without an air break after the metal deposition of step 601, thereby further reducing interfacial O present on surface 702 of metal nitride layer 103. However, such a configuration of multi-chamber processing system is uncommon, for the reasons discussed above, and generally an air break occurs between step 601 and step 603.

Figure 7D:
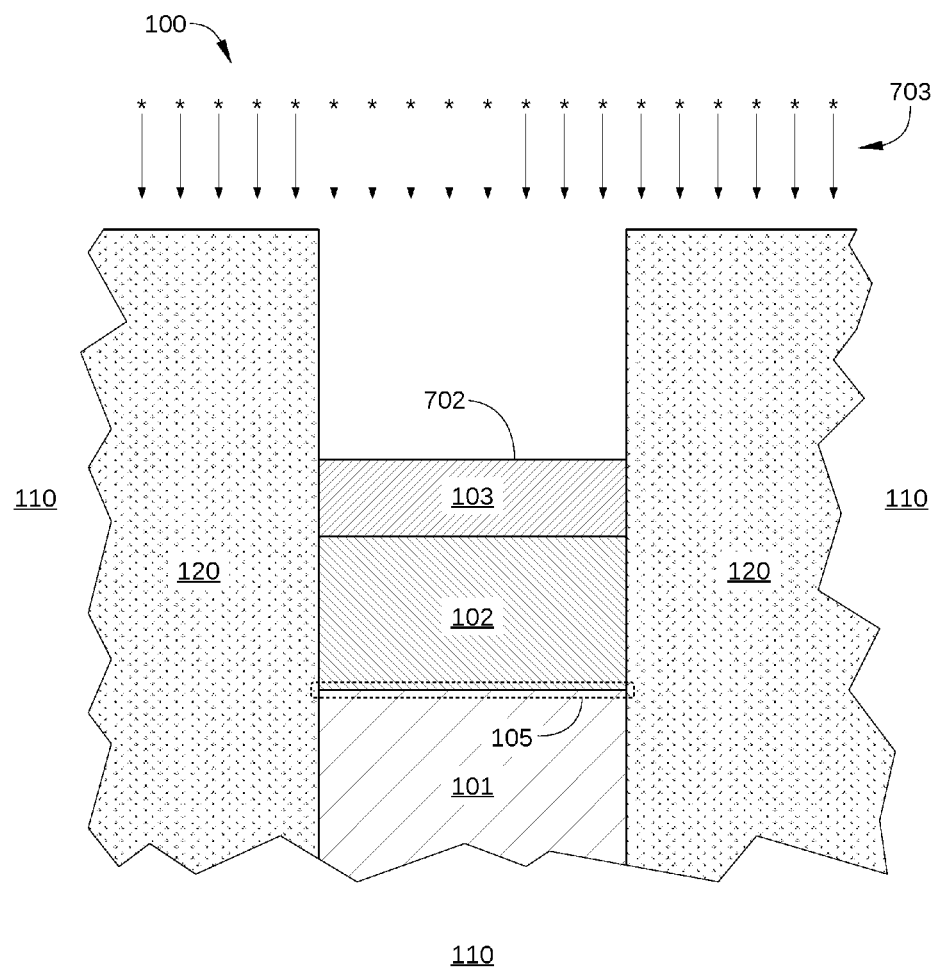

In step 604, a sequential hydrogenation/plasma nitridization process is performed on surface 702 of metal nitride layer 103. That is, surface 702 is exposed to hydrogen atoms and to plasma-excited nitrogen species 703, as shown in FIG. 7D. In some embodiments, a plasma hydrogenation process followed by a plasma nitridization process is performed in step 604. In embodiments in which the hydrogenation process is a plasma hydrogenation process, both the plasma hydrogenation process and the plasma nitridzation process may both be performed in processing chamber 400 and using process parameters described above in conjunction with FIG. 4. Alternatively, the plasma hydrogen process may be performed in one of processing chambers 514, 516, 518, 520, 522, and 524 of multi-chamber processing system 500, while the plasma nitridization process may be performed in another of processing chambers 514, 516, 518, 520, 522, and 524.

As noted previously, in some embodiments surface 702 of metal nitride layer 103 is exposed to hydrogen atoms via a thermal hydrogenation process. In such embodiments, the thermal hydrogenation process of step 604 is performed in one of processing chambers 514, 516, 518, 520, 522, and 524 of multi-chamber processing system 500, for example a rapid thermal processing chamber that is configured to use $H_2$ gas as a process gas. Furthermore, in such embodiments, the plasma nitridization process is performed in another of processing chambers 514, 516, 518, 520, 522, and 524, such as a processing chamber similar to plasma processing chamber 400 in FIG. 4. Thus, even though the thermal hydrogenation process and the plasma nitridization process are each performed in a different processing chamber, no air break occurs between these two processes.

Figure 7E:
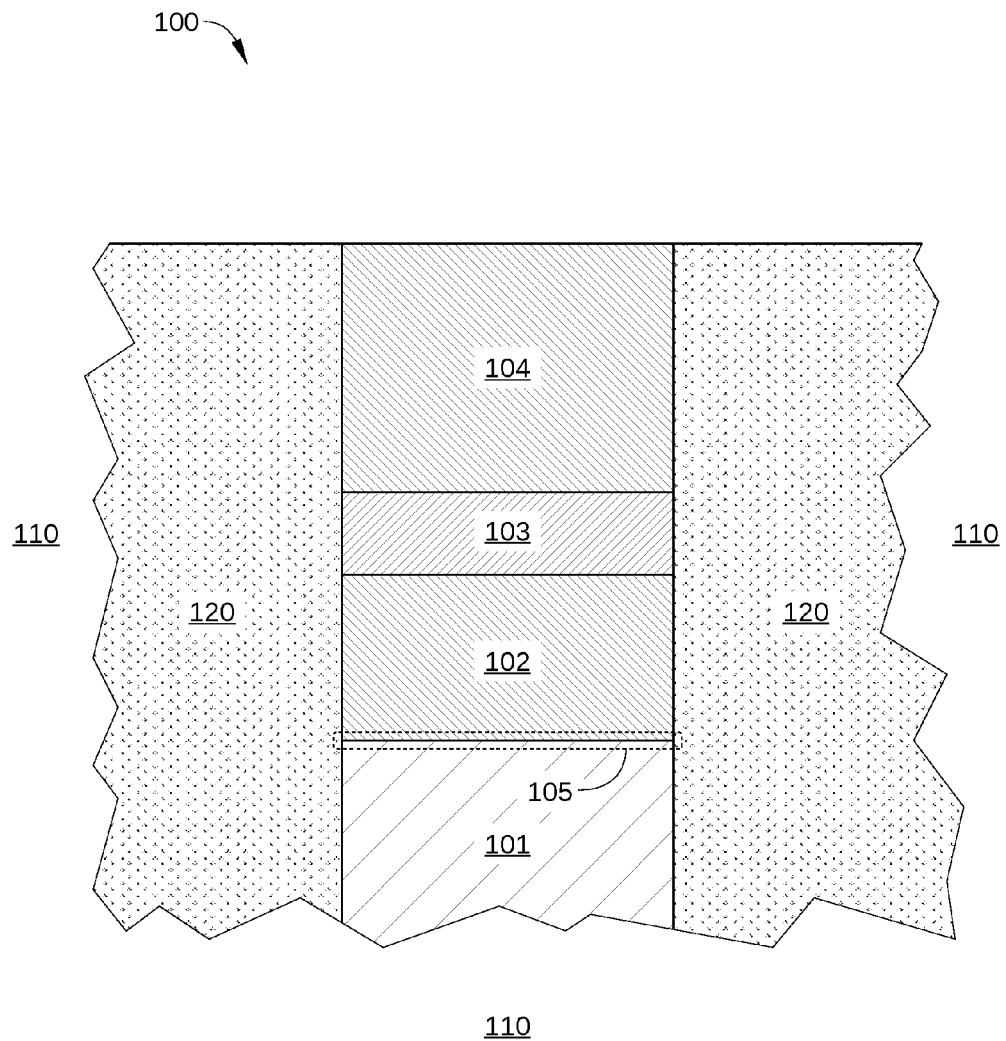

In step 605, capping layer 104 is deposited on the annealed first metal layer 102 and metal nitride layer 103, as shown in FIG. 7E. For example, in one embodiment, the metal capping layer is a Co layer or a layer of cobalt-containing alloy. Because interfacial O atoms that may be present on surface 702 of metal nitride layer 103 are removed during step 604, adhesion between capping layer 104 and metal nitride layer 103 is improved over the adhesion in contact structures formed via conventional techniques. Furthermore, the removal of O atoms within metal nitride layer 103 reduces the electrical resistivity of conductive structure 100.

In some embodiments, steps 604 and 605 are performed on the same multi-chamber processing system, so that no air break occurs after the sequential hydrogenation and nitridization processes of step 604. Consequently, oxidation of metal nitride layer 103 that may occur during exposure to atmosphere is avoided. In other embodiments, the processing chamber for performing the sequential hydrogenation and nitridization processing of step 604 may be configured on a different multi-chamber processing system than the processing chamber for performing step 605. It is noted that in such embodiments, the nitridization process of step 604 thoroughly nitridizes the surface of metal nitride layer 103, thereby minimizing or otherwise preventing oxidation that may take place during the air break between steps 604 and 605.

Figure 8:
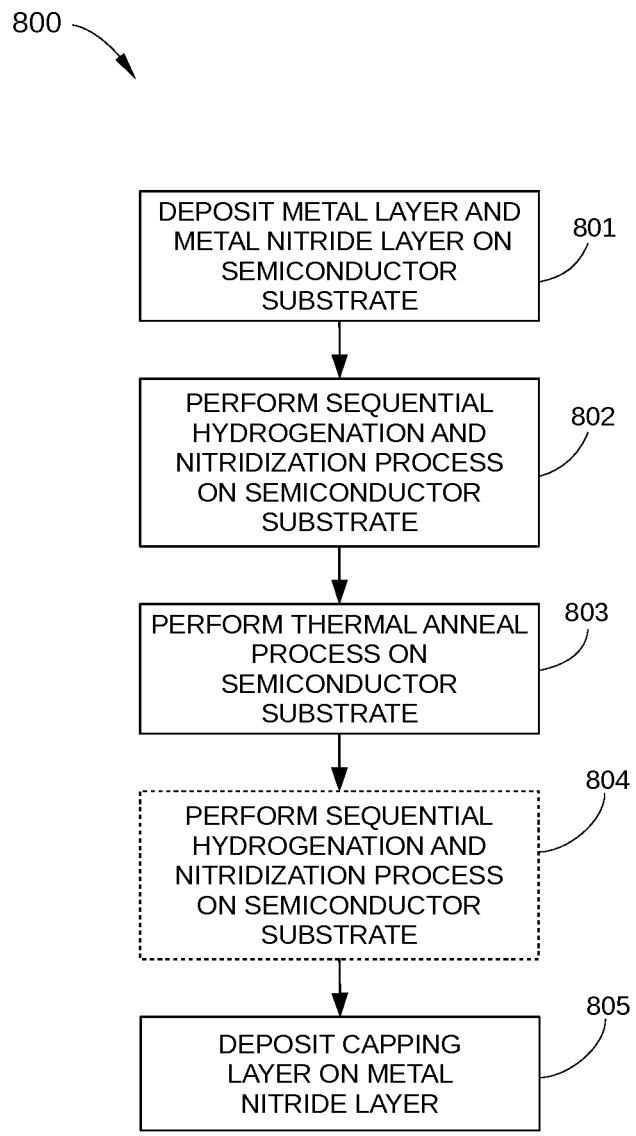
FIG. 8 sets forth a flow chart of process steps for reducing bulk and interfacial oxygen in a contact structure, according to some embodiments of the disclosure.

FIG. 8 sets forth a flow chart of process steps for reducing bulk and interfacial oxygen in a contact structure, according to some embodiments of the disclosure. Prior to step 801, a cleaning process or other surface preparation process may be performed as described above in conjunction with FIG. 7.

A method 800 begins at step 801, in which metal layer 102 and metal nitride layer 103 are deposited on source or drain structure 101. Step 801 may be substantially similar to step 601 in method 600.

In step 802, a sequential hydrogenation/plasma nitridization process is performed on surface 702 of metal nitride layer 103. That is, surface 702 is exposed to hydrogen atoms and to plasma-excited nitrogen species. Step 802 may be substantially similar to step 604 in method 600. However, it is noted that, unlike step 604, the sequential hydrogenation/plasma nitridization process of step 802 is performed prior to a thermal anneal process. Furthermore, in some embodiments, step 802 is performed in a chamber that is configured to be part of a multi-chamber processing system that includes a thermal anneal chamber for performing step 803, such as a rapid thermal processing chamber. In such embodiments, the effect of O atoms within first metal layer 102 and metal nitride layer 103 deposited in step 801 is further reduced, since such O atoms are removed prior to the anneal process of step 803.

In step 803, a thermal anneal process is performed on semiconductor substrate 110, including first metal layer 102, metal nitride layer 103, and source or drain structure 101. Step 803 may be substantially similar to step 603 in method 600. Alternatively, in embodiments in which a thermal hydrogenation process occurs in step 802, a thermal anneal process is performed in step 802 and step 803 may be skipped. For example, in some embodiments, the thermal anneal process by which silicide 105 is formed is performed in the same processing chamber as the thermal hydrogenation process of step 802. In such embodiments, the thermal anneal process may be performed concurrently with the thermal hydrogenation process, immediately prior to the thermal hydrogenation process, or immediately following the thermal hydrogenation process.

In optional step 804, a plasma treatment process is performed on surface 702 of metal nitride layer 103. Step 804 may be substantially similar to step 604 in method 700. Thus, in embodiments of method 800 in which step 804 is performed, a sequential hydrogenation/nitridization process is performed before and after the thermal anneal process of step 803. In some embodiments, the sequential hydrogenation/nitridization process performed in step 804 is substantially the same as the plasma treatment process performed in step 802. In other embodiments, the sequential hydrogenation/nitridization process of step 804 may be different than the sequential hydrogenation/nitridization process of step 802. For example, the process parameters of the sequential hydrogenation/nitridization process employed in step 802 may be different than the process parameters of the sequential hydrogenation/nitridization employed in step 804.

In step 805, a capping layer 104 and/or a conductive layer 106 are deposited on the annealed first metal layer 102 and metal nitride layer 103. Step 805 may be substantially similar to step 605 in method 600. Similarly, in some embodiments, steps 804 and 805 may be performed on the same multi-chamber processing system, so that no air break occurs after the plasma treatment process of step 804. Consequently, oxidation of metal nitride layer 103 that may occur during exposure to air is avoided, and adhesion between capping layer 104 and metal nitride layer 103 is improved over the adhesion in contact structures formed via conventional techniques.

Figure 9:
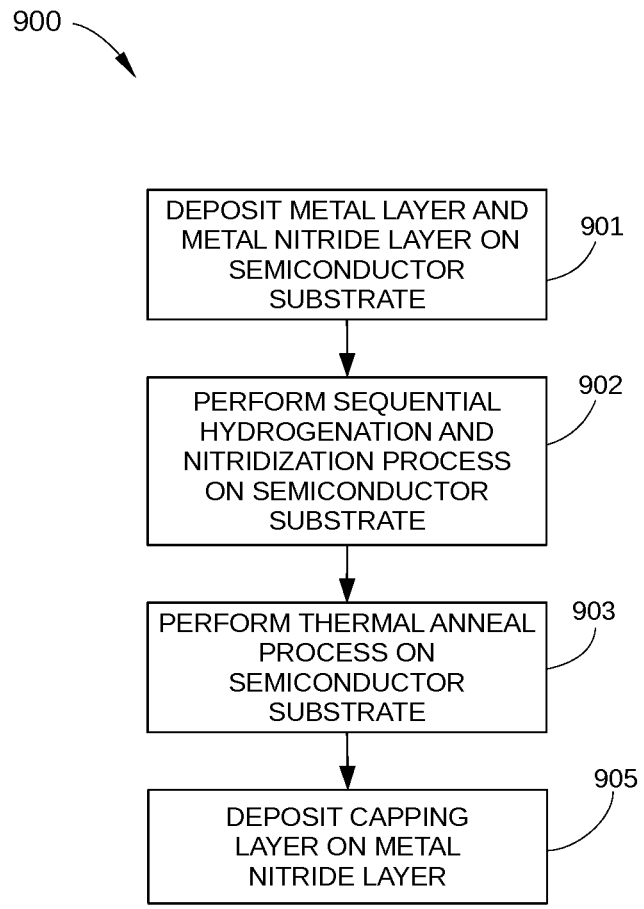
FIG. 9 sets forth a flow chart of process steps for reducing bulk and interfacial oxygen in a contact structure, according to some embodiments of the disclosure.

FIG. 9 sets forth a flow chart of process steps for reducing bulk and interfacial oxygen in a contact structure, according to some embodiments of the disclosure. Prior to step 901, a cleaning process or other surface preparation process may be performed as described above in conjunction with method 600. As shown, a method 900 begins at step 901, in which first metal layer 102 and metal nitride layer 103 are deposited on source or drain structure 101. Step 901 may be substantially similar to step 601 in method 600. In step 902, a sequential hydrogenation/nitridization process is performed on surface 702 of metal nitride layer 103. Step 902 may be substantially similar to step 802 in method 800. In step 903, a thermal anneal process is performed on semiconductor substrate 110, including first metal layer 102, metal nitride layer 103, and source or drain structure 101. Step 903 may be substantially similar to step 603 in method 600. In step 905, a capping layer 104 is deposited on the annealed first metal layer 102 and metal nitride layer 103. Step 905 may be substantially similar to step 605 in method 600. Thus, in method 900, a sequential hydrogenation/nitridization process is performed prior to the thermal anneal process of step 903, but not after the thermal anneal process of step 903. The sequential hydrogenation/nitridization process generally includes a plasma or thermal hydrogenation process and a plasma nitridization process.

Although methods 600, 700, and 800 are described for forming a contact structure on a substrate, methods 600, 700, and 800 may be employed to form other conductive structures on a substrate as well. Thus, any conductive structure that includes a metal nitride layer may benefit from being formed by method 600, 700, or 800.

Metal Gate Structure with Reduced EOT

According to various embodiments of the disclosure, a sequential hydrogenation and nitridization process is employed in the fabrication of a high-k dielectric/metal gate stack to reduce the effective oxide thickness (EOT) of the stack. In such embodiments, an EOT of the stack is reduced without the concomitant trade-off in increased leakage and flatband voltage shift that are known to occur when the high-k dielectric layer in the stack is simply reduced in thickness or otherwise scaled down via conventional techniques. One such stack is illustrated in FIG. 10.

Figure 10:
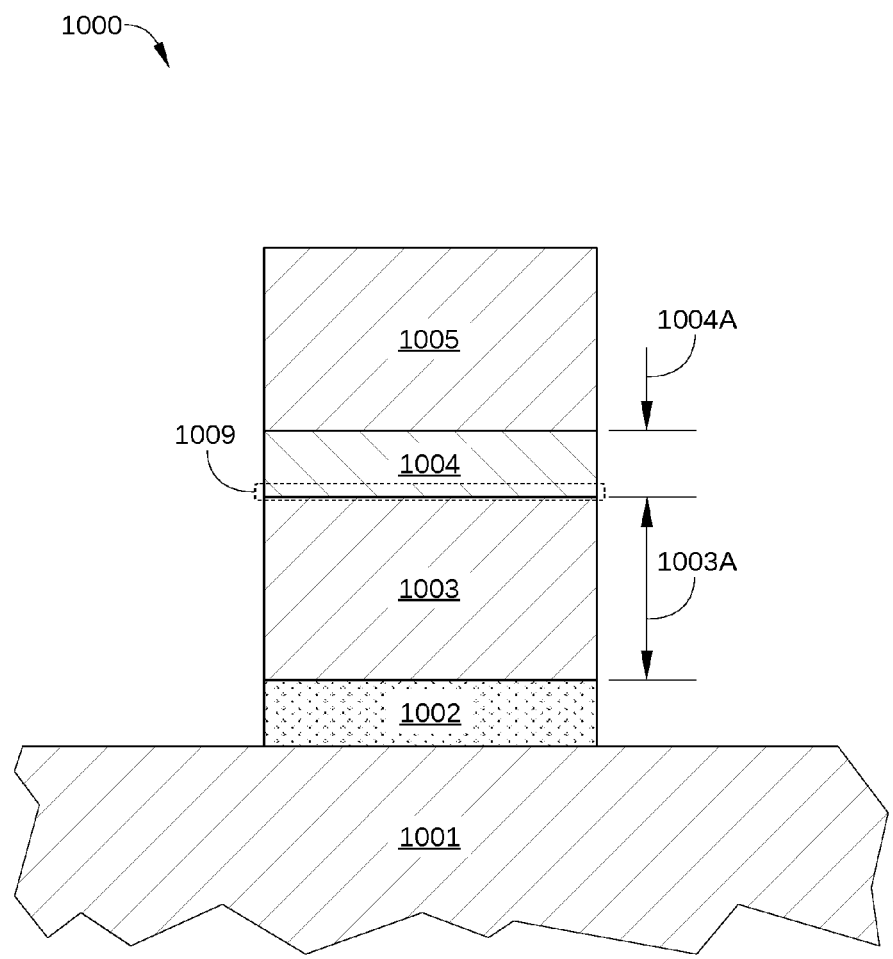
FIG. 10 illustrates a cross-sectional view of metal gate structure formed according to an embodiment of the disclosure.

FIG. 10 illustrates a cross-sectional view of a metal gate structure 1000 formed according to an embodiment of the disclosure. Metal gate structure 1000 is formed on a semiconductor substrate 1001 as part of a semiconductor device, such as a MOSFET or other FET. Metal gate structure 1000 is a stack of multiple material layers formed on a semiconductor substrate 1001 and includes, for example, an interfacial layer 1002 disposed on semiconductor substrate 1001, a high-k dielectric layer 1003 disposed on interface layer 1002, a metal nitride capping layer 1004 disposed on high-k dielectric layer 1003, and a metal gate electrode layer 1005 disposed on metal nitride capping layer 1004. In the embodiment illustrated in FIG. 10, the various layers of metal gate structure 1000 are depicted as a simple film stack formed on semiconductor substrate 1001. In practice, metal gate structure 1000 may be formed in a contact well or other cavity formed in an insulating or dielectric material similar to insulating material 120 in FIG. 1. Thus, one or more of interfacial layer 1002, high-k dielectric layer 1003, metal nitride capping layer 1004, and metal gate electrode layer 1005 may be material layers that are conformally deposited within such a cavity.

Semiconductor substrate 1001 may be any suitable semiconductor substrate on which metal gate structure 1000 can be formed. As such, semiconductor substrate 1001 may be formed from any suitable semiconductor material including, but not limited to Si (Si), Ge (germanium), silicon-germanium (Si—Ge), silicon-germanium-carbon (SiGeC), gallium (Ga), gallium arsenide (GaAs), indium arsenide (InAs), indium phosphide (InP), and all other III/V or II/VI compound semiconductors. Alternatively or additionally, semiconductor substrate 1001 may be a layered semiconductor such as, for example, Si/Si—Ge, a semiconductor-on-insulator (SOI) or a Si—Ge-on-insulator (SiGOI). Furthermore, in some embodiments, semiconductor substrate 1001 includes doped and/or undoped regions, such as an n-doped or p-doped region proximate interfacial oxide layer 1002.

Interfacial oxide layer 1002 is disposed on semiconductor substrate 1001 between semiconductor substrate 1001 and high-k dielectric layer 1003, and is configured as an interfacial oxide layer suitable for application in metal gate structure 1000. In embodiments in which semiconductor substrate 1001 includes a Si-containing material, interfacial oxide 1002 layer may include silicon oxide ($SiO_X$), silicon oxynitride (SiNO, $Si_2NO$, $Si_2N_2O$), and/or a nitrided silicon oxide. In embodiments in which semiconductor substrate 1001 is other than a Si-containing semiconductor material, interfacial oxide layer 1002 may comprise a semiconductor oxide, a semiconducting oxynitride and/or a nitrided semiconducting oxide.

Interfacial oxide layer 1002 may be formed via any suitable thermal or wet growing technique, for example, oxidation or oxynitridation. For example, and without limitation, interfacial oxide layer 1002 may be formed by a wet chemical oxidation process that includes treating a cleaned surface of semiconductor substrate 1001, such as an HF-last treated semiconductor surface, with a mixture of ammonium hydroxide, hydrogen peroxide and water. Alternatively, interfacial oxide layer 1002 may be formed by treating an HF-last treated semiconductor surface in ozonated aqueous solutions. Alternatively, interfacial oxide layer 1002 may be formed by any suitable thermal oxidation technique.

The thickness of interfacial oxide layer 1002 is a function of the semiconductor device of which metal gate structure 1000 is a part. In addition, interfacial oxide layer 1002 is significantly thinner than high-k dielectric layer 1003, metal nitride capping layer 1004, and metal gate electrode layer 1005. Typically, interfacial oxide layer 1002 has a thickness from about 0.5 to 2.0 nm, although in some embodiments interfacial oxide layer 1002 may be thicker. In some embodiments, thermal processes for device fabrication that occur subsequent to the formation of metal gate structure 1000 may further increase the thickness of interfacial oxide layer 1002.

High-k dielectric layer 1003 may be a gate dielectric layer or other dielectric layer in metal gate structure 1000, and includes a so-called "high-k dielectric" material. More specifically, high-k dielectric layer 1003 includes one or more materials that have a dielectric constant greater than that of $SiO_2$, such as a material having a dielectric constant of at least about 4.0, or ideally at least about 10.0. In addition, the high-k dielectric material included in high-k dielectric layer 1003 is suitable for use in an integrated circuit. Thus, in addition to a high dielectric constant, the one or more high-k dielectric materials included in high-k dielectric layer 1003 also ideally have the ability to prevent diffusion of dopants, few electrical defects that can compromise breakdown performance, good thermal stability, and high recrystallization temperature. Examples of such high-k dielectric materials suitable for use in high-k dielectric layer 1003 include, without limitation, silicon nitride, silicon oxynitride, metal oxides, metal nitrides, metal oxynitrides and/or metal silicates. In some embodiments, high-k dielectric layer 1003 includes one or more of hafnium oxide ($Hf_xO_y$), zirconium oxide ($ZrO_2$), hafnium silicate oxides ($Hf_xSi_{1-x}O_y$) or other hafnium-based dielectrics, lanthanum oxides ($La_2O_3$), aluminum oxide ($Al_2O_3$), titanium oxide ($TiO_2$), strontium titanate ($SrTiO_3$), lanthanum aluminate ($LaAlO_3$), yttrium oxide ($Y_2O_3$), hafnium silicate oxides ($Hf_xSi_{1-x}O_y$), lanthanum oxides ($La_2O_3$), and/or multilayered stacks thereof.

High-k dielectric layer 1003 may be formed via any suitable deposition method, including a thermal growth process such as, for example, an oxidation, nitridization or oxynitridization process. Alternatively, high-k dielectric layer 1003 may be formed by one or more deposition process including, but not limited to chemical vapor deposition (CVD), plasma enhanced chemical vapor deposition (PECVD), metalorgano chemical vapor deposition (MOCVD), atomic layer deposition (ALD), evaporation, reactive sputtering, chemical solution deposition and/or any combination of thereof.

A thickness 1003A of high-k dielectric layer 1003 may vary depending on the dielectric material included therein, the process used to form high-k dielectric layer 1003, and the geometry and operation of the semiconductor device in which metal gate structure 1000 is included. In some embodiments, thickness 1003A of high-k dielectric layer 1003 is from about 1.0 nm to about 20 nm.

Metal nitride capping layer 1004 is a metal layer disposed on high-k dielectric layer 1003 that is typically configured as an electrically conductive protective layer on high-k dielectric layer 1003. Thus, in some embodiments, metal nitride capping layer 1004 is configured to prevent unwanted oxidation of semiconductor substrate 1001 and/or high-k dielectric layer 1003. Furthermore, in such embodiments, metal nitride capping layer 1004 may also be configured to allow the diffusion of oxygen out of high-k dielectric layer 1003 during a thermal anneal process that occurs after the deposition of metal nitride capping layer 1004. In such embodiments, metal nitride capping layer 1004 may also be configured to allow the diffusion of oxygen out of an interfacial layer 1009 that is formed between high-k dielectric layer 1003 and metal nitride capping layer 1004 during the thermal anneal process.

In some embodiments, metal nitride capping layer 1004 includes a metal nitride, such as TiN, tantalum nitride (TaN), tantalum silicon nitride (TaSiN) and the like. It is noted that, in some embodiments, deposition of nitride capping layer 1004 on high-k dielectric layer 1003 can result in the formation of interfacial layer 1009 that is disposed at the interface between high-k dielectric layer 1003 and metal nitride capping layer 1004. According to some embodiments, interfacial layer 1009 is subsequently eliminated or reduced in thickness when a sequential plasma hydrogenation and nitridization process, as described herein, is applied to an exposed surface of metal nitride capping layer 1004.

Metal nitride capping layer 1004 may be formed via any suitable deposition method, including but not limited to a PVD process, a CVD process, a PECVD process, an MOCVD process, an ALD evaporation process, reactive sputtering, chemical solution deposition and/or any combination of thereof.

In some embodiments, metal nitride capping layer 1004 is significantly thinner than high-k dielectric layer 1003 and metal gate electrode layer 1005. For example, in an embodiment of metal gate structure 1000 in which high-k dielectric layer 1003 is a $HfO_2$ layer having thickness 1003A of about 20 nm to about 40 nm and metal gate electrode layer 1005 is a TiN layer having a thickness of about 20 nm to about 40 nm, metal nitride capping layer 1004 may have a thickness 1004A of about 5 nm to about 15 nm.

In some embodiments, thickness 1004A of metal nitride capping layer 1004 is selected to facilitate diffusion of oxygen atoms from high-k dielectric layer 1003 and/or interfacial layer 1009. Specifically, in such embodiments, thickness 1004A is selected so that O atoms diffuse from high-k dielectric layer 1003 and/or interfacial layer 1009 during a thermal anneal process that occurs after the deposition of metal nitride capping layer 1004. In such embodiments, thickness 1004A is selected to be less than a diffusion length of O atoms through metal nitride capping layer 1004 during the thermal anneal process. In one example, one such thermal anneal process is a spike anneal process performed on metal gate structure 1000 for a duration of 1-2 seconds and a peak temperature of about 700 to about 900° C.

Metal gate electrode layer 1005 is a metal layer formed on metal nitride capping layer 1004, and includes one or more deposited metal layers. In some embodiments, metal gate electrode layer 1005 is configured as a gate electrode and/or work function metal of metal gate structure 1000. In such embodiments, the one or more metal layers included in metal gate electrode layer 1005 are selected to have a collective gate electrode work function value that facilitates operation of metal gate structure 1000 and of a semiconductor device in which metal gate structure 1000 is included. Metal gate electrode 1005 may be formed via any suitable deposition method, including, but not limited to, CVD, PECVD, MOCVD, ALD, evaporation, reactive sputtering, chemical solution deposition and/or any combination of thereof.

In some embodiments, metal gate electrode layer 1005 is a p-metal gate material, such as TiN. Alternatively, in some embodiments, metal gate electrode layer 1005 is an n-metal gate. N-metals suitable for use in metal gate electrode layer 1005 include titanium aluminum carbide (Ti$_x$AlC).

Formation of Metal Gate Structure with Reduced EOT

According to various embodiments, during fabrication of metal gate structure 1000, a sequential plasma hydrogenation and nitridization process is performed on metal nitride capping layer 1004 prior to deposition of metal gate electrode layer 1005. In such embodiments, an EOT of metal gate structure 1000 is reduced, while a leakage current of metal gate structure 1000 is increased at a lower than expected magnitude. Furthermore, in such embodiments, metal gate structure 1000 displays little or no flatband voltage shift normally associated with a reduced EOT.

For example, in one embodiment of metal gate structure 1000, interfacial oxide layer 1002 has a thickness of about 1-2 nm, high-k dielectric layer 1003 has a thickness 1003A of about 2-3 nm, and metal nitride capping layer 1004 has a thickness 1004A of about 3-4 nm. In such an embodiment, one measurable effect of treating metal nitride capping layer 1004 with the sequential plasma hydrogenation and nitridization process described herein is a reduction of measured EOT of metal gate structure 1000 by approximately 1 Å (i.e., from about 9 Å down to about 8 Å). Another effect of such treatment of metal nitride capping layer 1004 is an increase in leakage current (at a flatband voltage of −1 V) by about 2.4 times (i.e., from about 0.268 A/cm$^2$ to about 0.658 A/cm$^2$. By contrast, according to well-established scaling trends known in the art, when EOT of metal gate structure 1000 is instead reduced by conventional techniques, such as by scaling thickness 1003A down by about 1 Å, leakage current is expected to increase by approximately a factor of 10. Thus, it has been found that the treatment of the metal nitride capping layer 1004 with the herein described sequential plasma hydrogenation and nitridization process has the effect of reducing EOT of metal gate structure 1000 with approximately one quarter of the increased leakage current as that associated with simply scaling down thickness 1004A of metal nitride capping layer 1004.

Furthermore, flatband voltage shift measured in metal gate structure 1000 has been shown to remain substantially constant when metal gate structure 1000 is formed with the sequential plasma hydrogenation and nitridization process, despite the above-described reduction in EOT. Thus, application of the sequential plasma hydrogenation and nitridization process to metal nitride capping layer 1004 enables the fabrication of metal gate structure 1000 with reduced EOT without flatband voltage shift and the resulting impact on device design.

Figure 11:
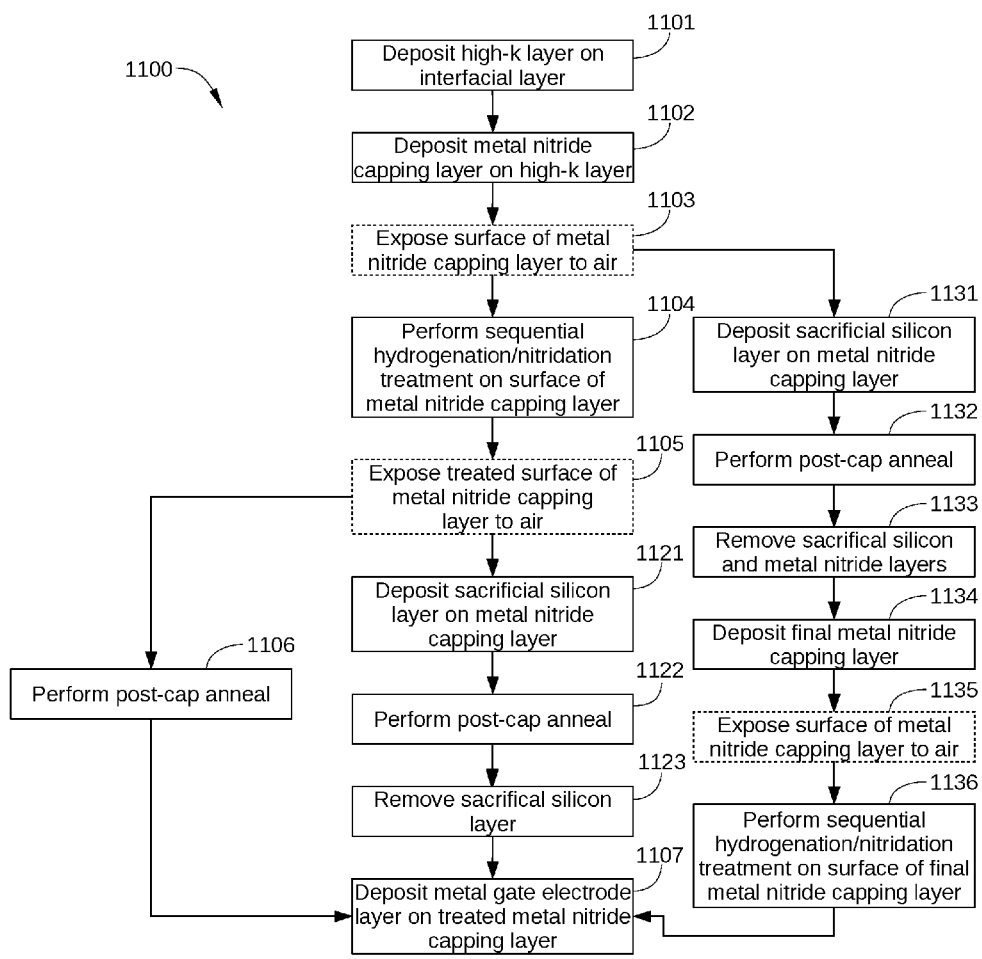
FIG. 11 sets forth a flow chart of process steps for reducing effective oxide thickness (EOT) in a metal gate structure, according to various embodiments of the disclosure.

FIG. 11 sets forth a flow chart of process steps for reducing EOT in a metal gate structure, according to various embodiments of the disclosure. FIGS. 12A-12J are schematic cross-sectional views of a semiconductor device corresponding to different stages of the process of FIG. 11, according to various embodiments of the disclosure.

Figure 12A:
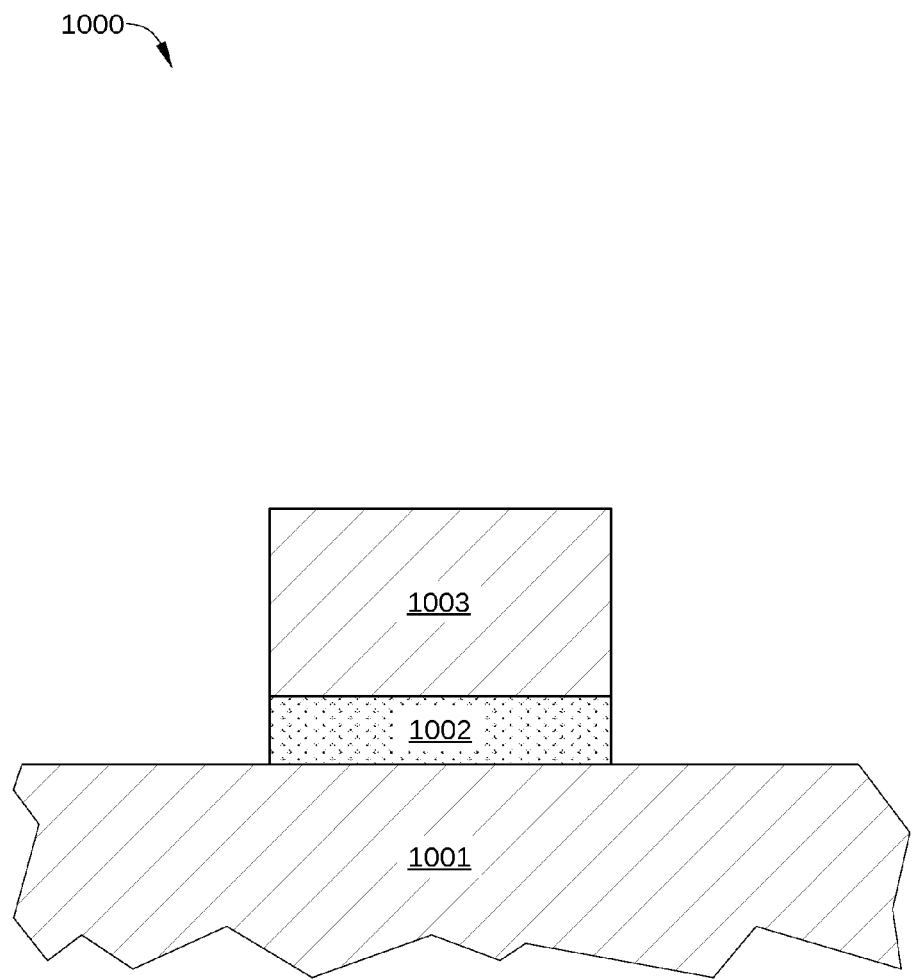
FIGS. 12A-12J are schematic cross-sectional views of a semiconductor device corresponding to different stages of the process of FIG. 11, according to various embodiments of the disclosure.

A method 1100 begins at step 1101, in which high-k dielectric layer 1003 is deposited on interfacial oxide layer 1002 as shown in FIG. 12A. High-k dielectric layer 1003 may be formed via any suitable deposition method described above in conjunction with FIG. 10.

Figure 12B:
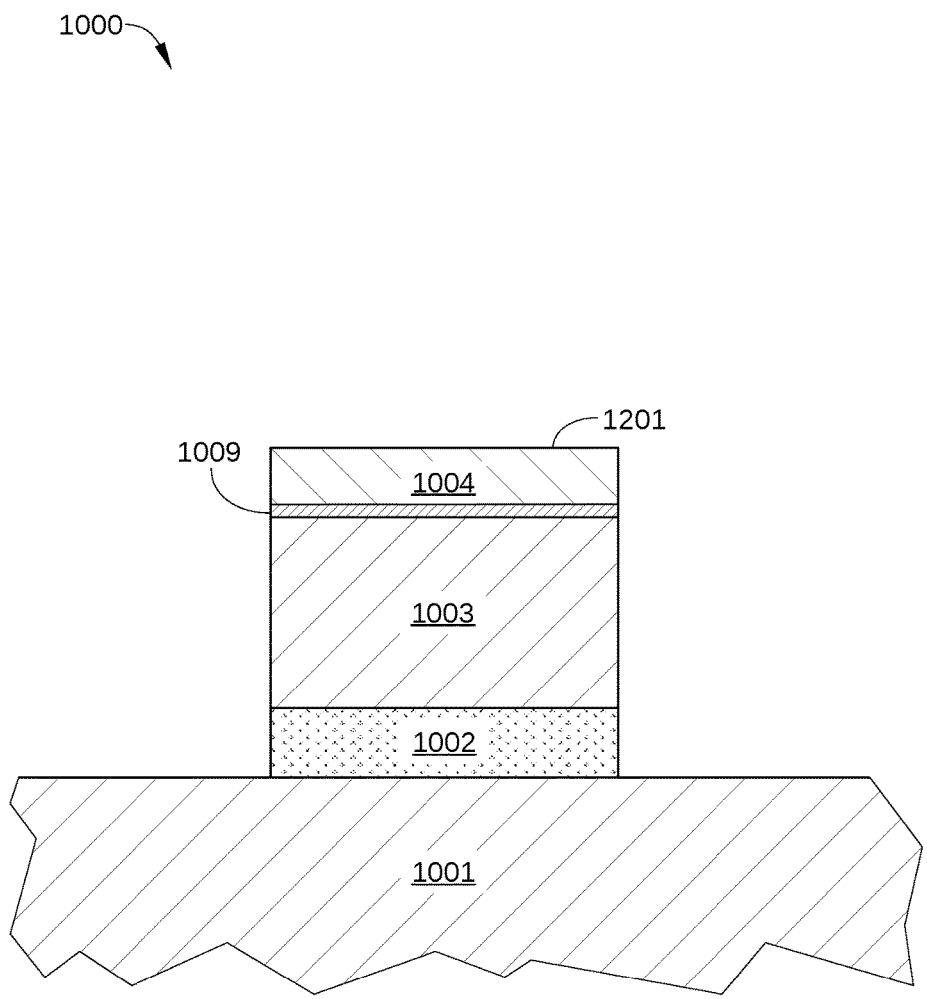

In step 1102, metal nitride capping layer 1004 is deposited on high-k dielectric layer 1003, as shown in FIG. 12B. Metal nitride capping layer 1004 may be formed via any suitable deposition method described above in conjunction with FIG. 10. In some embodiments, deposition of metal nitride capping layer 1004 results in the formation of interfacial layer 1009, which is disposed at the interface between high-k dielectric layer 1003 and metal nitride capping layer 1004. In such embodiments, interfacial layer 1009 generally includes vacancies (that may be similar to vacancies 213 in FIG. 2A) and/or O atoms incorporated therein by contamination present in the processing environment during the deposition process of step 1102.

In optional step 1103, an exposed surface 1201, shown in FIG. 12B, is exposed to air. For example, in some embodiments, metal nitride capping layer 1004 is deposited in one processing system, such as multi-chamber processing system 500 in FIG. 5, while the next processing step to be performed on semiconductor substrate 1001 is performed in a different processing system. Thus, in such embodiments, semiconductor substrate 1001 is exposed to air after the deposition of metal nitride layer 1004. In embodiments in which metal nitride capping layer 1004 is deposited in one chamber of a multi-chamber processing system and step 1104 is performed in one or two other processing chambers of the same multi-chamber processing system, optional step 1103 is not performed.

In embodiments in which the metal nitride capping layer 1004 deposited in step 1102 is a sacrificial metal nitride layer that is subsequently removed, method 1100 proceeds to step 1131. In embodiments in which the metal nitride capping layer 1004 deposited in step 1102 is retained in metal gate structure 1000, method 1100 proceeds to step 1104. In some embodiments, the sacrificial metal nitride layer may be removed by use of a subsequent wet or dry etching process that is selective to the removal of the metal nitride capping layer 1004.

Figure 12C:
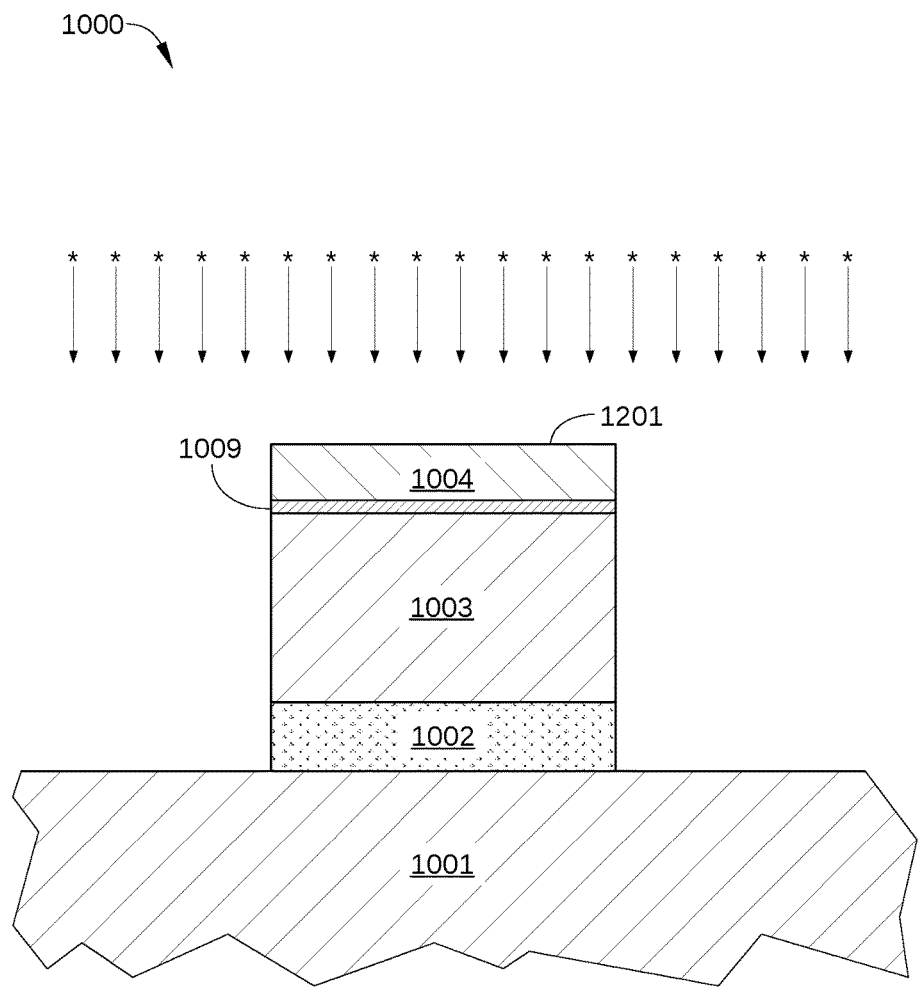

In step 1104, a sequential plasma hydrogenation and nitridization process is performed on surface 1201 of metal nitride capping layer 1004, as shown in FIG. 12C. The plasma hydrogenation and nitridization processes may be substantially similar to the plasma hydrogenation and nitridization processes described above in conjunction with FIG. 4, except that the plasma hydrogenation process includes non-oxidizing plasma-excited hydrogen species, and does not include any oxidizing plasma-excited hydrogen species.

In some embodiments, the plasma hydrogenation process of step 1104 is performed for a duration of between about 30 seconds and about 150 seconds, at a chamber pressure of between about 20 mT and about 100 mT, at a processing temperature (such as substrate pedestal temperature) of between about 400° C. and about 500° C., with an RF power of between about 500 W and about 1500 W, a flow rate of H$_2$ of between about 20 sccm and about 100 sccm, and a flow rate of Ar of between about 900 sccm and about 980 sccm. In some embodiments, the flow rate of H$_2$ is between about 1% and about 15% of the total process gases introduced into the chamber. In some embodiments, the plasma hydrogenation process of step 1104 is performed for a duration of between about 85 seconds and about 95 seconds, at a chamber pressure of between about 45 mT and about 55 mT, at a processing temperature of between about 425° C. and about 475° C., with an RF power of between about 700 W and about 800 W, a flow rate of H$_2$ of between about 45 sccm and about 55 sccm, and a flow rate of Ar of between about 965 sccm and about 955 sccm.

In some embodiments, the plasma nitrogenation process of step 1104 is performed for a duration of between about 30 seconds and about 150 seconds, at a chamber pressure of between about 10 mT and about 50 mT, at a processing temperature of between about 400° C. and about 500° C., with an RF power of between about 500 W and about 1500

W, a flow rate of NH$_3$ of between about 1% and about 10% of the total process gas flow rate, a flow rate of N$_2$ of between about 45% and about 55% of the total process gas flow rate, and a flow rate of Ar selected to equal the remainder of process gas flow. In some embodiments, the plasma nitrogenation process of step 1104 is performed for a duration of between about 85 seconds and about 95 seconds, at a chamber pressure of between about 15 mT and about 25 mT, at a processing temperature of between about 425° C. and about 475° C., with an RF power of between about 700 W and about 800 W, a flow rate of NH$_3$ of between about 2% and about 3% of the total process gas flow rate, a flow rate of N$_2$ of between about 45% and about 55% of the total process gas flow rate, and a flow rate of Ar selected to equal the remainder of process gas flow.

Figure 12D:
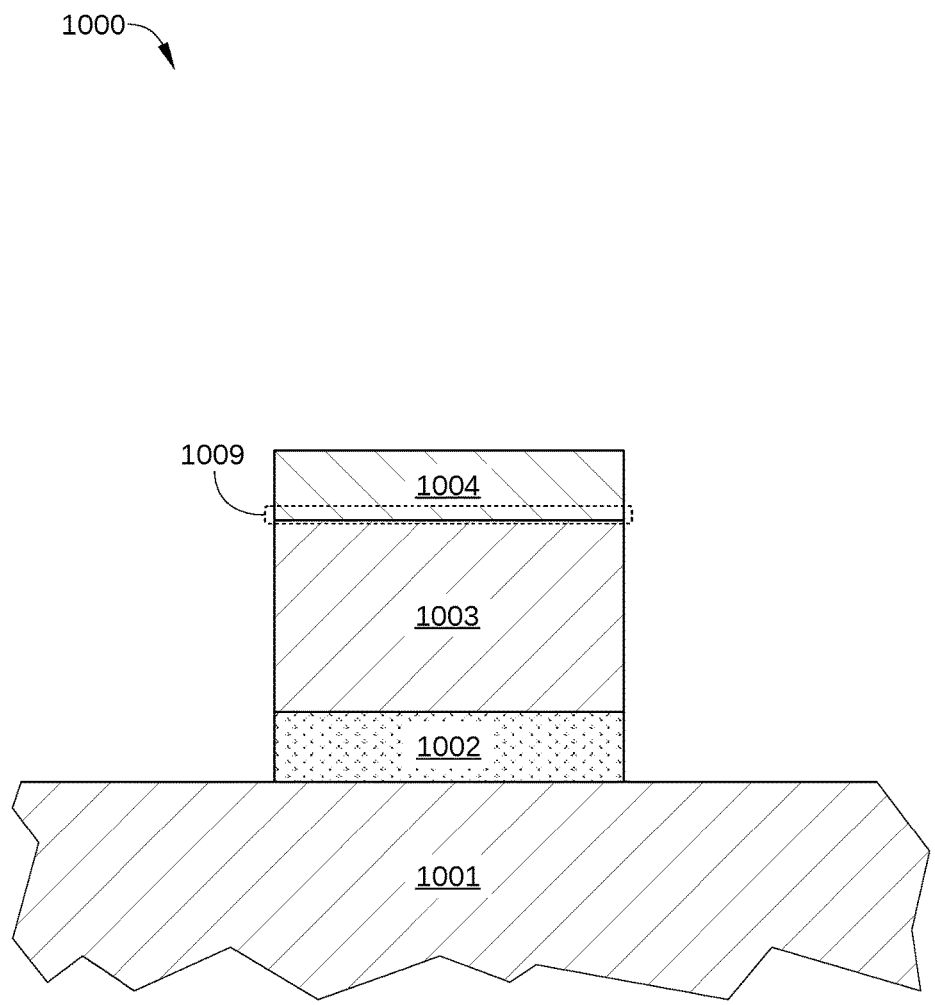

In sum, in step 1104, surface 1201 is exposed to plasma-excited hydrogen species generated in the plasma hydrogenation process, and some or all oxides present on surface 1201 are reduced. In addition, in some embodiments, such plasma-excited hydrogen species can also reduce some or all oxygen (O) atoms present in the bulk material of metal nitride capping layer 1004. Furthermore, in step 1104 surface 1201 is exposed to plasma-excited nitrogen species generated in the plasma nitridization process, thereby saturating surface 1201 with N atoms and, in some embodiments, filling vacancies present in the bulk material of metal nitride capping layer 1004 with N atoms. Thus, in some embodiments, interfacial layer 1009 is eliminated or significantly reduced, as shown in FIG. 12D.

In some embodiments, the plasma hydrogenation process of step 1104 is performed in the same processing chamber as the plasma nitridization process of step 1104, for example in process chamber 400 of FIG. 4. Alternatively, the plasma hydrogenation process of step 1104 is performed in a first processing chamber of a multi-chamber processing system, while the plasma nitridization process of step 1104 is performed in a second processing chamber of the same multi-chamber processing system. In either case, it is noted that surface 1201 is not exposed to air between the plasma hydrogenation process and the plasma nitridization process of step 1104. Thus, in either embodiment, surface 1201 is not exposed to air after being exposed to the plasma-excited hydrogen species and before being exposed to the plasma-excited nitrogen species.

In some embodiments, prior to performing the plasma hydrogenation process in a processing chamber, an oxygen-free conditioning process is performed in the processing chamber, for example to reduce trace oxygen contamination in the processing chamber. In such embodiments, the processing chamber is treated with an oxygen-free plasma without a substrate placed therein and before the substrate is treated via the above-described plasma hydrogenation process. Such plasma treatment of the process chamber prior to introducing a substrate to the chamber is sometimes referred to as a plasma every wafer (PEW) process or PEW treatment.

In some embodiments, such a PEW process includes introducing one or more non-oxygen-containing gases, such as N$_2$, NH$_3$, Ar, H$_2$, or any suitable combination thereof, into the process chamber, and energizing the one or more gases to form an oxygen-free plasma. Alternatively, the PEW process may include introducing plasma-containing radicals and/or ions of N, H, or NH$_3$, or any suitable combination thereof, into the process chamber, where the plasma is formed in a remote plasma source outside of the process chamber. In one embodiment, an NH$_3$ gas or a combination of NH$_3$ and Ar gases is introduced into the process chamber. In another embodiment, H$_2$ gas or a combination of H$_2$ and Ar gases is introduced into the process chamber. In yet another embodiment, N$_2$ gas or a combination of N$_2$ and Ar gases is introduced into the process chamber.

Typically, the plasma treatment of the processing chamber prior to introducing the substrate involves introducing or forming a plasma containing hydrogen and/or nitrogen in the process chamber. In some embodiments, radicals generated from the plasma inside the processing chamber during the PEW process, such as N*, NH*, and/or H*, react with trace O atoms within the processing chamber.

In some embodiments, during the PEW process, the one or more gases introduced into the processing chamber are energized by an RF power source, such as RF power source 414 of FIG. 4. The RF power may be pulsed at 2% to 70% duty cycle and may range from about 100 W to about 2500 W. The RF power may be a continuous wave ranging from about 100 W to about 2500 W. In such embodiments, the PEW process of step 1104 is performed for a duration of between about 20 seconds and about 100 seconds, at a chamber pressure of between about 100 mT and about 200 mT, at a processing temperature of between about 400° C. and about 500° C., with an RF power of between about 250 W and about 750 W, a flow rate of H$_2$ of between about 50 sccm and about 200 sccm, and a flow rate of O$_2$ of between about 450 sccm and about 550 sccm.

In optional step 1105, exposed surface 1201 is exposed to air. For example, in some embodiments, the above-described sequential hydrogenation and nitridization process is performed in one processing system, while the next processing step to be performed on semiconductor substrate 1001 is performed in a different processing system. Thus, in such embodiments, semiconductor substrate 1001 is exposed to air after the deposition of metal nitride layer 1004. In embodiments in which the sequential hydrogenation and nitridization process is performed in one chamber of a multi-chamber processing system and step 1106 is performed in another processing chamber of the same multi-chamber processing system, optional step 1105 is not performed.

In embodiments in which a sacrificial silicon-containing layer is subsequently deposited and removed as part of the formation of metal gate structure 1000, method 1100 proceeds from step 1105 to step 1121. In embodiments in which no sacrificial silicon layer is deposited in forming metal gate structure 1000, method 1100 proceeds to step 1106. The sacrificial silicon-containing layer may be formed by use of a CVD or ALD process that uses one or more silicon containing precursor gases to form the deposited layer.

In step 1106, a thermal anneal process, such as a post-cap anneal, is performed on semiconductor substrate 1001, interfacial layer 1002, high-k dielectric layer 1003, and metal nitride capping layer 1004. For example, in some embodiments, a spike anneal process is performed in step 1106, in which a peak temperature of about 600 to 900° C. is reached. The post-cap anneal is performed on partially formed metal gate structure 1000 to smooth interface, repair unsaturated bonds, and inject thermal energy into metal nitride capping layer 1004.

Figure 12E:
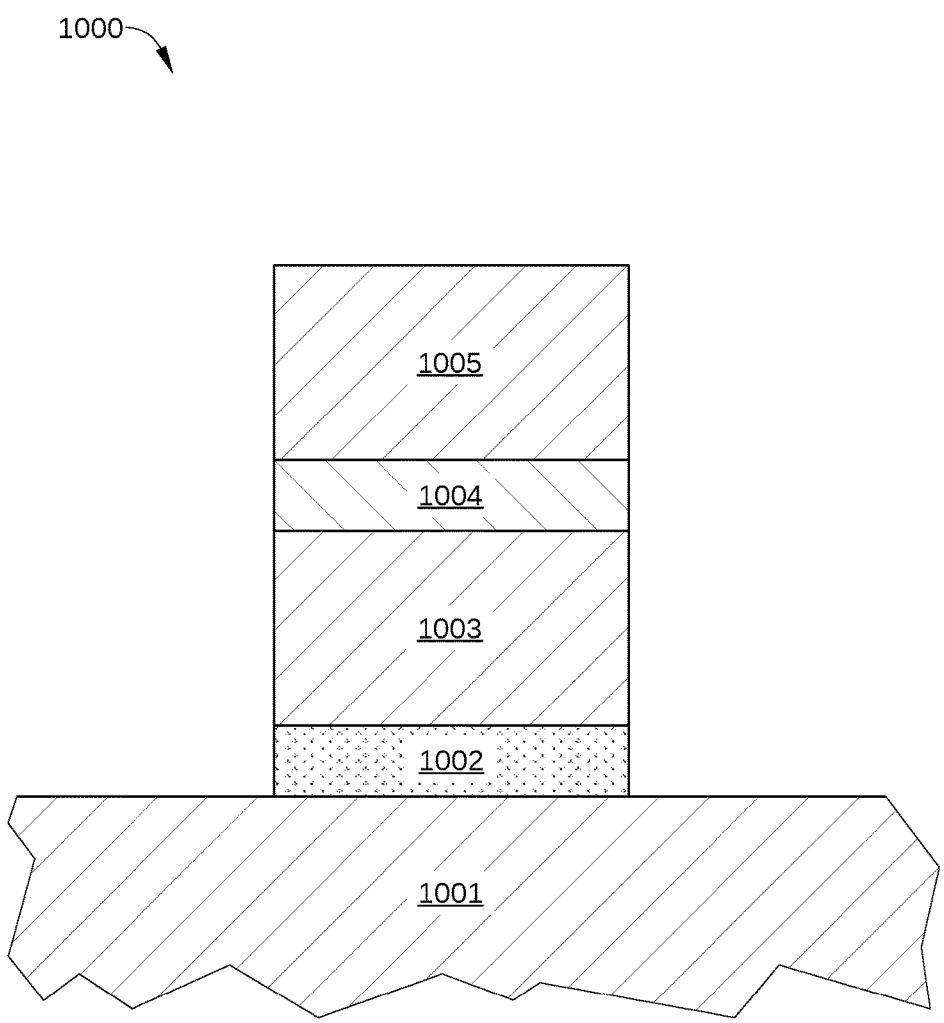

In step 1107, metal gate electrode layer 1005 is deposited on the treated metal nitride capping layer 1004, as shown in FIG. 12E, thereby completing formation of metal gate structure 1000. Metal gate electrode layer 1005 may be formed via any suitable deposition method described above in conjunction with FIG. 10.

Figure 12F:
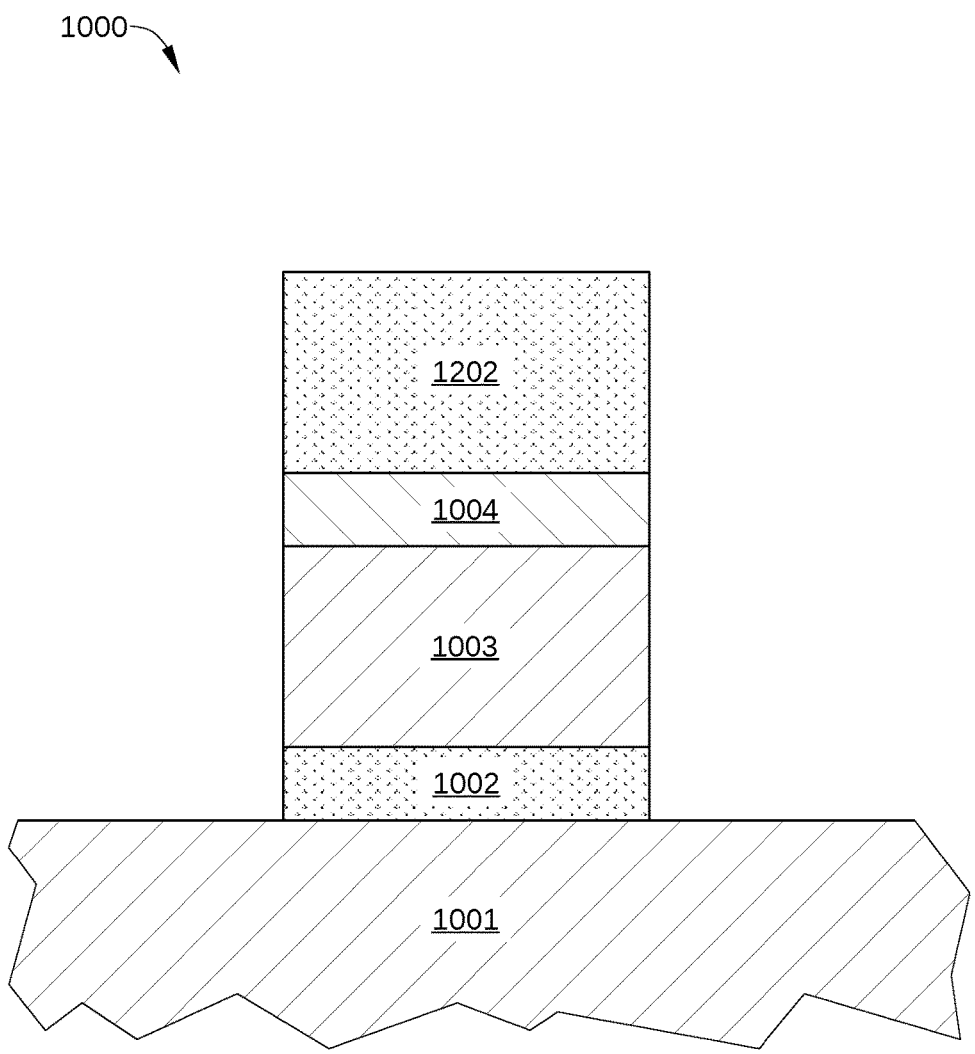

In step 1121, a sacrificial silicon layer 1202 is deposited on metal nitride capping layer 1004, as shown in FIG. 12F.

Step 1121 is performed after surface 1201 of metal nitride capping layer 1004 is treated by the sequential plasma hydrogenation and nitridization process of step 1104 and the optional air exposure of step 1105.

The sacrificial silicon layer 1202 may include any suitable silicon-containing material, such as amorphous silicon, and may be deposited using any suitable deposition process known in the art, such as a CVD process. Sacrificial silicon layer 1202 is deposited on metal nitride capping layer 1004 to reduce the formation of oxides in metal nitride capping layer 1004, interfacial layer 1009 (if still present), and high-k dielectric layer 1003 during a subsequent thermal anneal process, such as a so-called post-cap anneal process. In some embodiments, the post-cap anneal process includes an atmospheric thermal anneal process. Consequently, further oxidation of the very thin layers of metal gate structure 1000 can occur, including interfacial layer 1002, high-k dielectric layer 1003, and metal nitride capping layer 1004, thereby increasing the EOT of metal gate structure 1000. However, the presence of sacrificial silicon layer 1202 can shield the layers of metal gate structure 1000 from atmospheric O atoms during the pre-cap anneal process. In addition, sacrificial silicon layer 1202 can react with, and thereby retain, O atoms diffusing out of high-k dielectric layer 1003, interfacial layer 1009 (if still present), and metal nitride capping layer 1004 during a thermal anneal process. Thus, sacrificial silicon layer 1202 minimizes or eliminates the potential for unwanted oxidation of portions of metal gate structure 1000 during a subsequent thermal anneal process.

In step 1122, a thermal anneal process, such as a post-cap anneal, is performed on semiconductor substrate 1001, interfacial layer 1002, high-k dielectric layer 1003, metal nitride capping layer 1004, and sacrificial silicon layer 1202. The thermal anneal process of step 1122 may be substantially similar to the thermal anneal process of step 1106, described above.

In step 1123, sacrificial silicon layer 1202 is removed from metal gate structure 1000. Any technically feasible removal process may be employed in step 1123, include a selective wet-etching process, a plasma-based dry-etching process, a chemical-mechanical polishing process, or any combination thereof. Method 1100 then proceeds to step 1107, in which the final layer of metal gate structure 1000 is deposited.

Figure 12G:
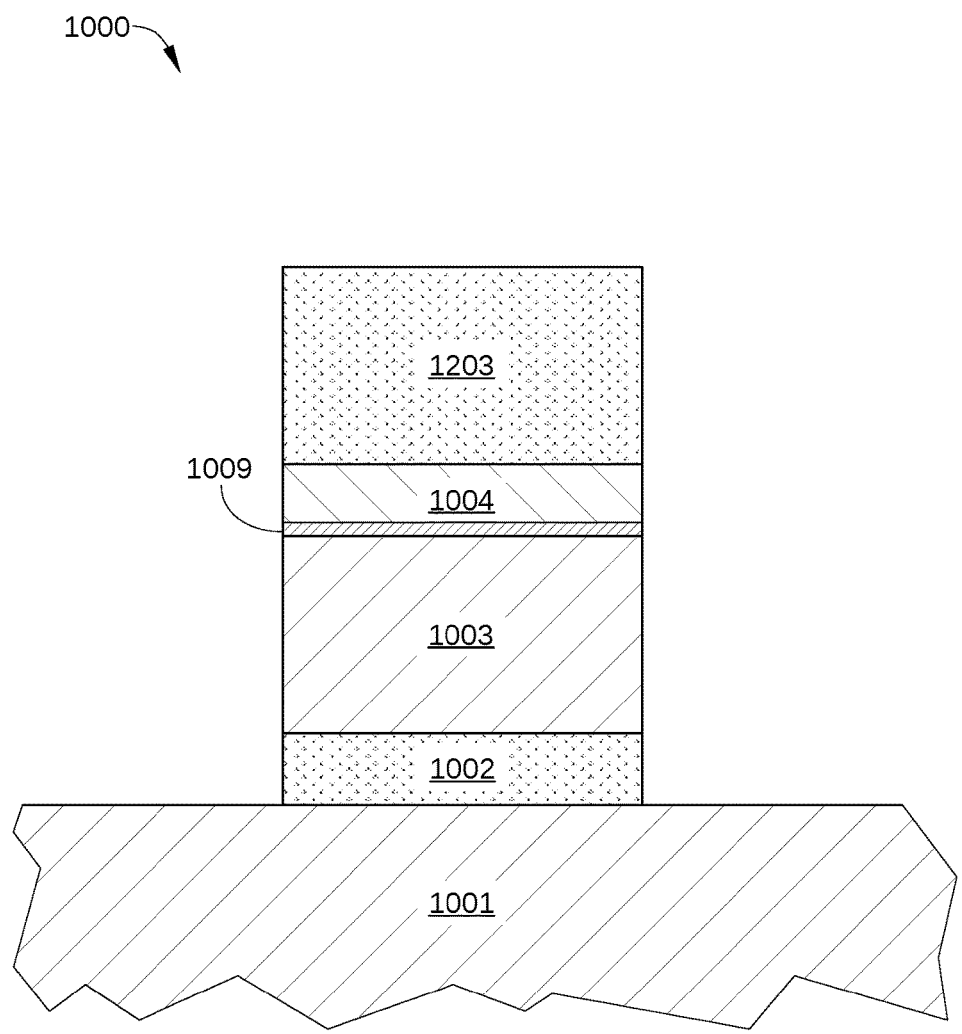

In step 1131, a sacrificial silicon layer 1203 is deposited on metal nitride capping layer 1004, as shown in FIG. 12G. Sacrificial silicon layer 1203 may be substantially similar to sacrificial silicon layer 1202 deposited in step 1131. However, it is noted that in step 1131, metal nitride capping layer 1004 has not been treated with a sequential plasma hydrogenation and nitridization process. Consequently, metal nitride capping layer 1004 may still include interfacial layer 1009, as shown.

In step 1132, a thermal anneal process, such as a post-cap anneal, is performed on semiconductor substrate 1001, interfacial layer 1002, high-k dielectric layer 1003, metal nitride capping layer 1004, interfacial layer 1009, and sacrificial silicon layer 1203. The thermal anneal process of step 1132 may be substantially similar to the thermal anneal process of step 1106, described above.

Figure 12H:
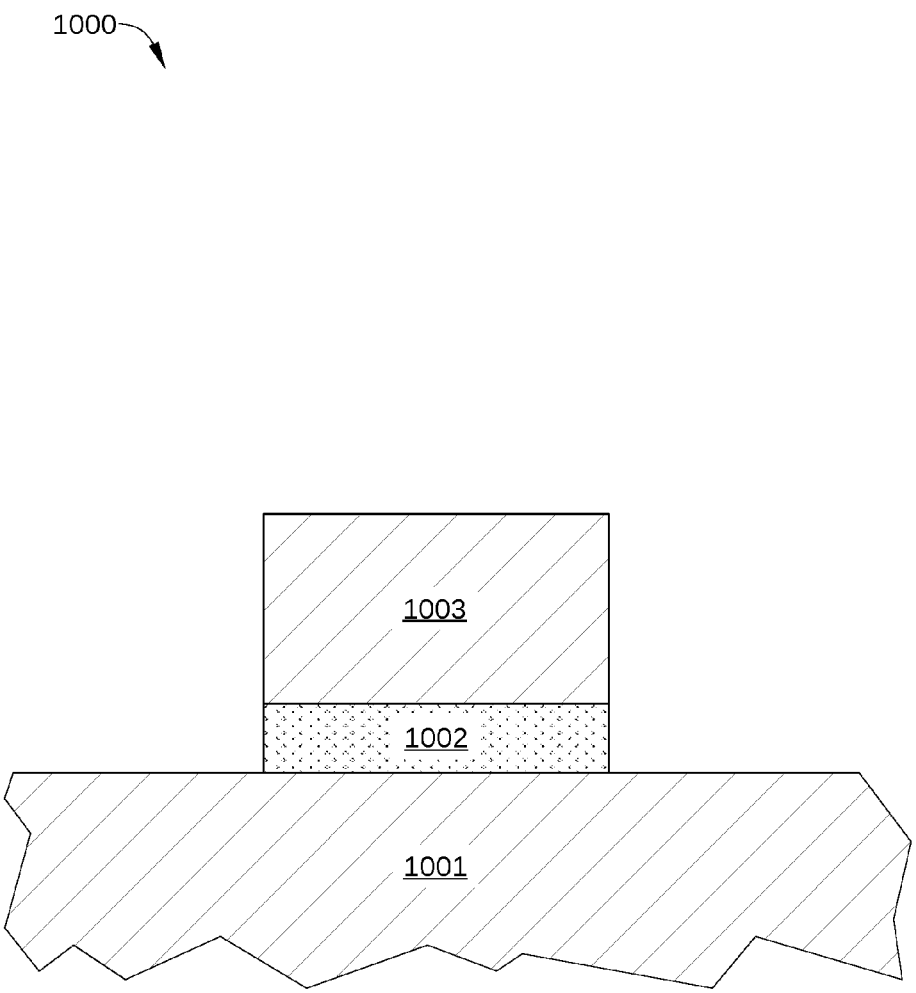

In step 1133, sacrificial silicon layer 1203, metal nitride capping layer 1004, and interfacial layer 1009 are removed from metal gate structure 1000, as shown in FIG. 12H. Any technically feasible removal process or combination of processes may be employed in step 1123, include a selective wet-etching process, a plasma-based dry-etching process, a chemical-mechanical polishing process, or any combination thereof. Method 1100 then proceeds to step 1134.

Figure 12I:
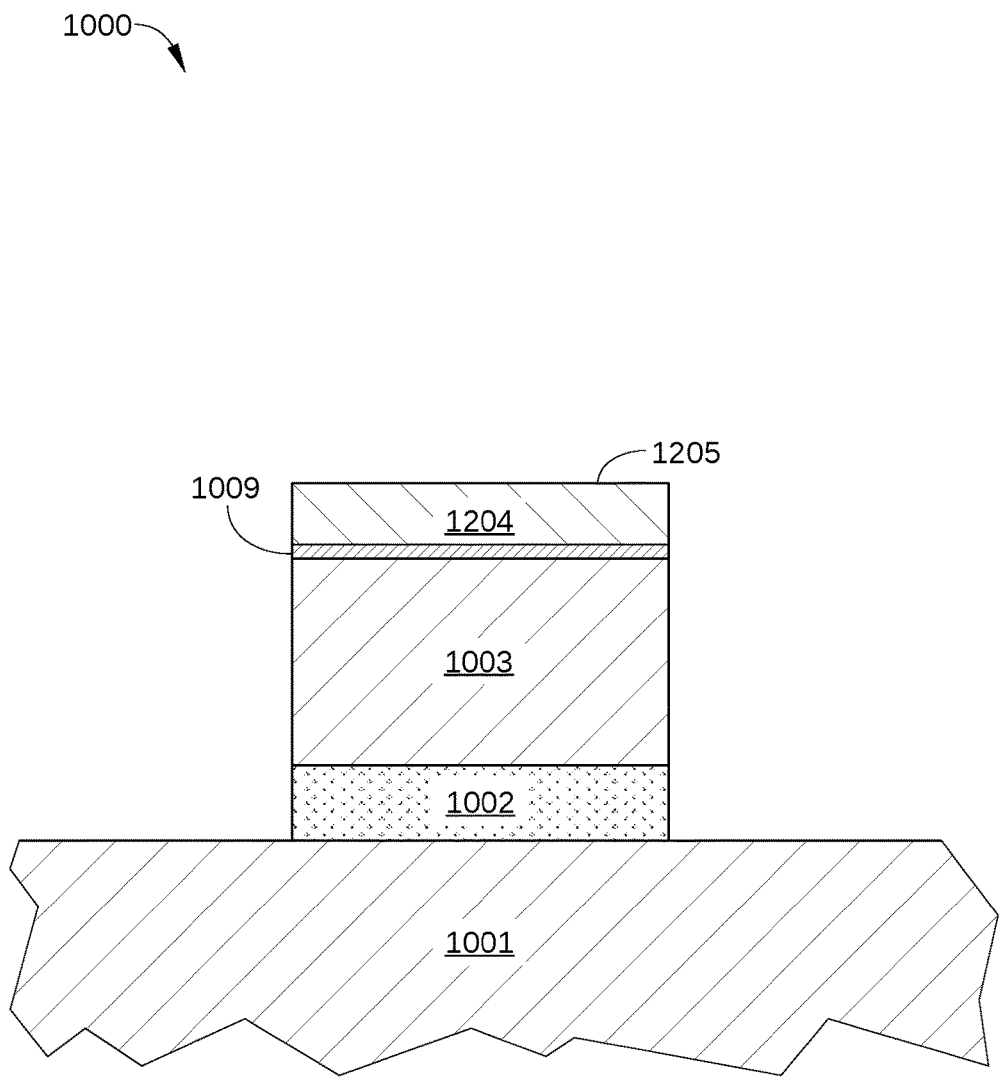

In step 1134, a final metal nitride capping layer 1204 is deposited on high-k dielectric layer 1003, as shown in FIG. 12I. Final metal nitride capping layer 1204 may be substantially similar to metal nitride capping layer 1004, and may include interfacial layer 1009.

In optional step 1135, an exposed surface 1205, shown in FIG. 12I, is exposed to air. For example, in some embodiments, final metal nitride capping layer 1204 is deposited in one processing system, while the next processing step to be performed on semiconductor substrate 1001, i.e., step 1136, is performed in a different processing system. Thus, in such embodiments, semiconductor substrate 1001 is exposed to air after the deposition of final metal nitride layer 1204. In embodiments in which final metal nitride capping layer 1204 is deposited in one chamber of a multi-chamber processing system and step 1136 is performed in one or two other processing chambers of the same multi-chamber processing system, optional step 1135 is not performed.

Figure 12J:
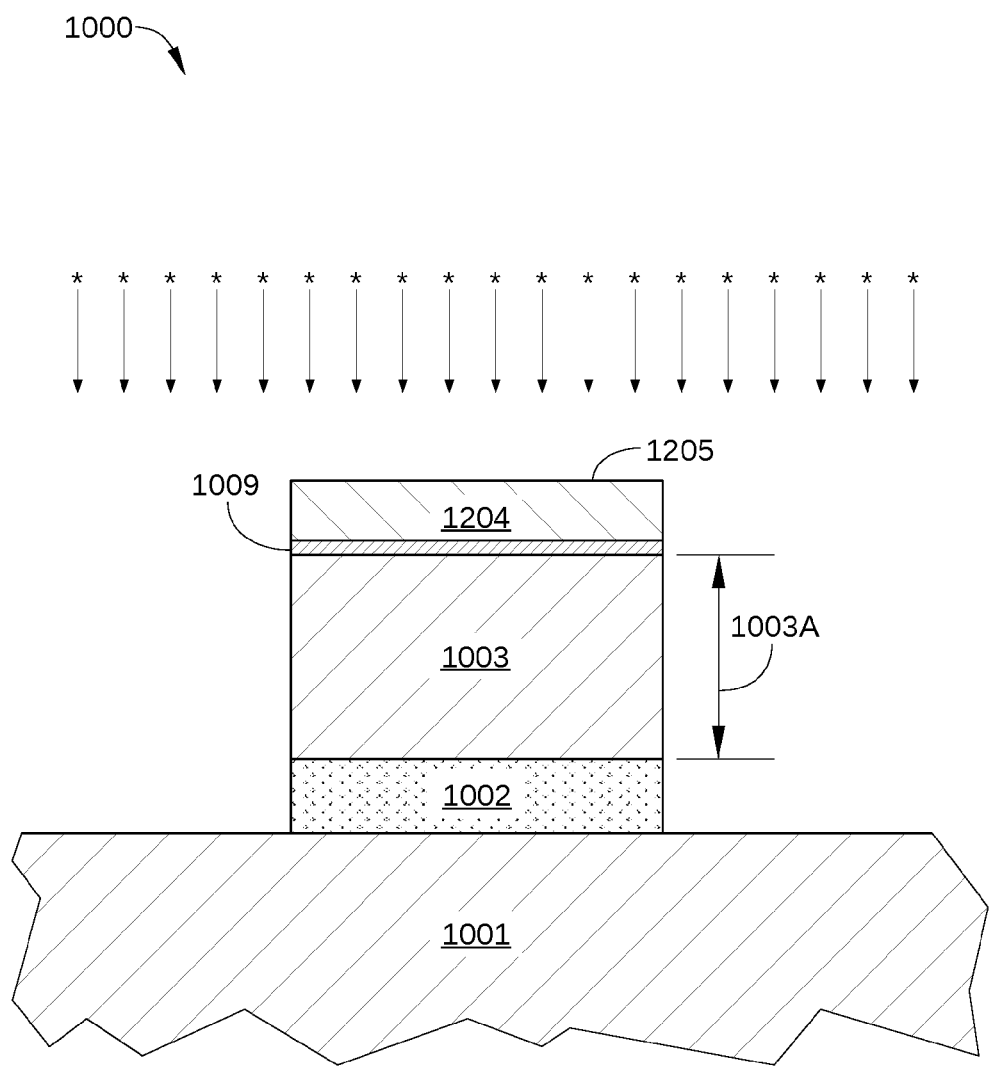

In step 1136, a sequential plasma hydrogenation and nitridization process is performed on surface 1205 of final metal nitride capping layer 1204, as shown in FIG. 12J. The sequential plasma hydrogenation and nitridization process performed in step 1136 may be substantially similar to that employed in step 1104. Consequently, interfacial layer 1009 may be eliminated or reduced during step 1136, thereby removing O atoms present in final metal nitride capping layer 1204, interfacial layer 1009, and, in some embodiments, high-k dielectric layer 1003. As a result, EOT of metal gate structure 1000 is reduced without scaling down thickness 1003A of high-k dielectric layer 1003.

After the sequential plasma hydrogenation and nitridization process is performed in step 1136, method 1100 proceeds to step 1107, in which the final layer of metal gate structure 1000 is deposited. In embodiments in which step 1136 and 1107 are performed in different processing systems, semiconductor substrate 1001 is necessarily exposed to air. However, because the plasma nitridization process of step 1136 can completely or almost completely nitridzide the exposed surface 1205 of final metal nitride capping layer 1204, little or no oxidation thereof generally takes place during this air exposure.

In some embodiments disclosed herein, a sequential hydrogenation/nitridization process is employed to enable the formation of a metal gate structure with a reduced EOT over a similar structure formed via conventional methods. A plasma hydrogenation process followed by a plasma nitridization process is performed on a metal nitride layer in a film stack, thereby removing O atoms disposed within layers of the film stack and, in some embodiments eliminating an oxygen-containing interfacial layer disposed within the film stack. As a result, EOT of the metal gate structure is reduced with little or no accompanying flatband voltage shift. Further, the metal gate structure operates with an increased leakage current that is as little as one quarter the increase in leakage current associated with a similar metal gate structure formed via conventional techniques.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a structure in a semiconductor device, the method comprising:

depositing a high-k dielectric layer on a semiconductor substrate;
depositing a metal nitride layer on the high-k dielectric layer to form a portion of the structure, wherein the portion includes the metal nitride layer and the high-k dielectric layer and has a first effective oxide thickness, and wherein the deposited metal nitride layer has an exposed surface;
sequentially exposing the exposed surface to a non-oxidizing plasma-excited hydrogen species followed by plasma-excited nitrogen species to reduce the first effective oxide thickness to a second effective oxide thickness;
depositing a silicon-containing layer on the exposed surface;
performing a thermal anneal process on the silicon-containing layer; and removing the silicon-containing layer.

2. The method of claim 1, further comprising, after sequentially exposing the exposed surface to the plasma-excited hydrogen species followed by the plasma-excited nitrogen species, depositing a metal layer on the exposed surface of the metal nitride layer, wherein the metal nitride layer and the metal layer each comprise a different electrically conductive material.

3. The method of claim 2, wherein the structure comprises a p-metal gate structure and the metal layer comprises a work-function metal of the p-metal gate structure.

4. The method of claim 2, further comprising, after sequentially exposing the exposed surface to the non-oxidizing plasma-excited hydrogen species followed by the plasma-excited nitrogen species and prior to depositing the metal layer on the exposed surface of the metal nitride layer, exposing the exposed surface to air.

5. The method of claim 1, further comprising, prior to depositing the high-k dielectric layer, forming a silicon-dioxide containing interface layer on which the high-k dielectric layer is subsequently formed.

6. The method of claim 1, wherein the exposed surface is not exposed to air after being exposed to the plasma-excited hydrogen species and before being exposed to the plasma-excited nitrogen species.

7. The method of claim 1, further comprising, prior to depositing the metal nitride layer on the high-k dielectric layer:
depositing a sacrificial metal nitride layer on the high-k dielectric layer; and, following the thermal anneal process,
removing the sacrificial metal nitride layer and the silicon-containing layer.

8. A method of forming a structure in a semiconductor device, the method comprising:
depositing a high-k dielectric layer on a semiconductor substrate;
depositing a metal nitride layer on the high-k dielectric layer to form a portion of the structure, wherein the portion includes the metal nitride layer and the high-k dielectric layer and has a first effective oxide thickness, and wherein the deposited metal nitride layer has an exposed surface;
performing an oxygen-free plasma treatment process on a process chamber; and
sequentially exposing the exposed surface to a non-oxidizing plasma-excited hydrogen species in the process chamber, followed by a plasma-excited nitrogen species, to reduce the first effective oxide thickness to a second effective oxide thickness.

9. The method of claim 8, wherein the oxygen-free plasma treatment process is performed on the process chamber when the semiconductor substrate is not disposed within the process chamber.

10. A method of forming a structure in a semiconductor device, the method comprising:
depositing a high-k dielectric layer on a semiconductor substrate;
depositing on the high-k dielectric layer a metal nitride layer;
sequentially exposing an exposed surface of the metal nitride layer to a plasma-excited hydrogen species followed by plasma-excited nitrogen species;
after sequentially exposing the exposed surface to the plasma-excited hydrogen species followed by the plasma-excited nitrogen species, exposing the exposed surface to air; and
after exposing the exposed surface to air, performing a thermal anneal process on the high-k dielectric layer and the metal nitride layer for a particular time and at a particular temperature.

11. The method of claim 10, after performing the thermal anneal process, depositing a metal layer on the exposed surface of the metal nitride layer, wherein the metal nitride layer and the metal layer each comprise a different electrically conductive material.

12. The method of claim 10, wherein exposing the exposed surface to the plasma-excited hydrogen species comprises exposing the exposed surface to a non-oxidizing plasma-excited hydrogen species.

13. The method of claim 10, wherein the metal nitride layer has a thickness that is less than a diffusion length of oxygen in the metal nitride layer when the metal nitride layer undergoes the thermal anneal process.

14. A method of forming a structure in a semiconductor device, the method comprising:
depositing a high-k dielectric layer on a semiconductor substrate;
depositing a metal nitride layer on the high-k dielectric layer to form a portion of the structure, wherein the portion includes the metal nitride layer and the high-k dielectric layer and has a first effective oxide thickness, and wherein the deposited metal nitride layer has an exposed surface;
reducing the first effective oxide thickness to a second effective oxide thickness by sequentially exposing the exposed surface to a non-oxidizing plasma-excited hydrogen species followed by plasma-excited nitrogen species, wherein exposing the exposed surface to the non-oxidizing plasma-excited hydrogen species comprises, while the semiconductor substrate is positioned in a processing chamber having a chamber pressure of between about 20 mT and about 100 mT, generating a plasma with radio frequency power of between about 500 W and about 1500 W and flowing hydrogen gas ($H_2$) into the processing chamber at a rate of between about 20 sccm and about 100 sccm and Ar at a rate of between about 900 sccm and about 980 sccm.

15. The method of claim 14, wherein a processing temperature of the processing chamber is between about 400° C. and about 500° C. while the plasma is being generated.

16. A method of forming a structure in a semiconductor device, the method comprising:
depositing a high-k dielectric layer on a semiconductor substrate;
depositing a metal nitride layer on the high-k dielectric layer to form a portion of the structure, wherein the portion includes the metal nitride layer and the high-k dielectric layer and has a first effective oxide thickness, and wherein the deposited metal nitride layer has an exposed surface;

reducing the first effective oxide thickness to a second effective oxide thickness by sequentially exposing the exposed surface to a non-oxidizing plasma-excited hydrogen species followed by plasma-excited nitrogen species, wherein exposing the exposed surface to the plasma-excited nitrogen species comprises, while the semiconductor substrate is positioned in a processing chamber having a chamber pressure of between about 10 mT and about 50 mT, generating a plasma with radio frequency power of between about 500 W and about 1500 W, flowing ammonia gas ($NH_3$) into the processing chamber at a rate of between about 1% and about 10% of a total process gas flow rate, flowing nitrogen ($N_2$) gas into the processing chamber at a rate of between about 45% and about 55% of the total process gas flow rate, and flowing argon (Ar) into the processing chamber at a remainder process gas flow rate.

17. The method of claim 16, wherein a processing temperature of the processing chamber is between about 400° C. and about 500° C. while the plasma is being generated.

18. The method of claim 16, wherein exposing the exposed surface to the non-oxidizing plasma-excited hydrogen species followed by plasma-excited nitrogen species comprises sequentially exposing the exposed surface to the plasma-excited hydrogen species followed by the plasma-excited nitrogen species in a same processing chamber.

* * * * *

UNITED STATES PATENT AND TRADEMARK OFFICE
CERTIFICATE OF CORRECTION

| | | |
|---|---|---|
| PATENT NO. | : 10,103,027 B2 | Page 1 of 1 |
| APPLICATION NO. | : 15/442311 | |
| DATED | : October 16, 2018 | |
| INVENTOR(S) | : Johanes S. Swenberg et al. | |

It is certified that error appears in the above-identified patent and that said Letters Patent is hereby corrected as shown below:

On the Title Page

Item (72) Replace the Fourth Named Inventor, Shashank Sharma with --Steven C.H. Hung--.

Signed and Sealed this
Twenty-fourth Day of March, 2020

Andrei Iancu
*Director of the United States Patent and Trademark Office*